(12) United States Patent
Kasugai et al.

(10) Patent No.: US 8,942,269 B2
(45) Date of Patent: Jan. 27, 2015

(54) NITRIDE SEMICONDUCTOR LIGHT-EMITTING DEVICE

(71) Applicant: Panasonic Corporation, Osaka (JP)

(72) Inventors: Hideki Kasugai, Shiga (JP); Kenji Orita, Osaka (JP); Hiroshi Ohno, Osaka (JP); Kazuhiko Yamanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/029,543

(22) Filed: Sep. 17, 2013

(65) Prior Publication Data

US 2014/0023103 A1 Jan. 23, 2014

Related U.S. Application Data

(63) Continuation of application No. PCT/JP2012/001144, filed on Feb. 21, 2012.

(30) Foreign Application Priority Data

Mar. 24, 2011 (JP) .................. 2011-066507

(51) Int. Cl.
*H01S 5/00* (2006.01)
*H01S 5/323* (2006.01)
*H01L 33/20* (2010.01)
*H01S 5/32* (2006.01)
(Continued)

(52) U.S. Cl.
CPC .............. *H01S 5/323* (2013.01); *H01L 33/20* (2013.01); *H01S 5/3211* (2013.01); *H01L 33/0045* (2013.01); *H01S 5/0421* (2013.01); *H01S 5/0425* (2013.01); *H01S 5/2009* (2013.01); *H01S 5/22* (2013.01); *H01S 5/34333* (2013.01); *H01S 5/3214* (2013.01)
USPC ........................................ 372/44.01

(58) Field of Classification Search
CPC . H01L 33/0045; H01S 5/0421; H01S 5/0425; H01S 5/323
USPC ........................................ 372/44.01
See application file for complete search history.

(56) References Cited

U.S. PATENT DOCUMENTS 6,990,132 B2 1/2006 Kneissl et al.
7,279,751 B2 10/2007 Ueda et al.
(Continued)

FOREIGN PATENT DOCUMENTS

JP 09-074249 A 3/1997
JP 2004-289157 A 10/2004
(Continued)

OTHER PUBLICATIONS

International Search Report issued in PCT/JP2012/001144, dated Mar. 27, 2012.

*Primary Examiner* — Tuan Nguyen
(74) *Attorney, Agent, or Firm* — McDermott Will & Emery LLP

(57) ABSTRACT

A nitride semiconductor light-emitting device having an optical waveguide includes, in the following order, at least: a first cladding layer; an active layer; and a second cladding layer, wherein the second cladding layer includes (i) a transparent conductive layer comprising a transparent conductor and (ii) a nitride semiconductor layer comprising a nitride semiconductor, the nitride semiconductor layer being formed closer to the active layer than the transparent conductive layer.

3 Claims, 17 Drawing Sheets

(51) Int. Cl.
*H01L 33/00* (2010.01)
*H01S 5/042* (2006.01)
*H01S 5/20* (2006.01)
*H01S 5/22* (2006.01)
*H01S 5/343* (2006.01)

(56) References Cited

U.S. PATENT DOCUMENTS 7,826,512 B2 11/2010 Ueda et al.
8,023,544 B2 * 9/2011 Bour et al. ............... 372/45.01
8,254,423 B2 * 8/2012 Cohen et al. ............. 372/45.01
2004/0184497 A1 9/2004 Kneissl et al.
2005/0279994 A1 12/2005 Ueda et al.
2007/0098030 A1 5/2007 Ha et al.
2008/0008220 A1 1/2008 Ueda et al.

FOREIGN PATENT DOCUMENTS

| | | |
|---|---|---|
| JP | 2006-041491 A | 2/2006 |
| JP | 2007-129236 A | 5/2007 |
| JP | 2010-016261 A | 1/2010 |
| JP | 2010-021271 A | 1/2010 |

* cited by examiner

FIG. 3

| | | | Structure A | Structure B | Structure C | Structure D | Structure E | Structure F |
|---|---|---|---|---|---|---|---|---|
| Parameters for caluculation | Optical waveguide (120) | Width | 1.5 μm | | | | | |
| | | Length | 800 μm | | | | | |
| | Lower cladding layer (102) | | $Al_{0.05}Ga_{0.95}N$ | | | | | |
| | Lower guide layer (103) | | GaN | | | | | |
| | Quantum well active layer (104) | Material | InGaN/GaN multiple quantum well | | | | | |
| | | Emission wavelength | 405 nm | | | | | |
| | Upper guide layer (105) | Material | GaN | | | | | |
| | | Thickness | 0.1 μm | | | | | |
| | First upper cladding layer (108) | Material | $Al_{0.05}Ga_{0.95}N$ | - | GaN | $Al_{0.05}Ga_{0.95}N$ | $Al_{0.05}Ga_{0.95}N$ | $Al_{0.2}In_{0.1}Ga_{0.7}N$ |
| | | Refractive index | 2.50 | - | 2.53 | 2.50 | 2.50 | 2.50 |
| | | Thickness | 0.45 μm | - | 0.15 μm | 0.15 μm | 0.15 μm | 0.15 μm |
| | | Extinction coefficient | 0 | - | 0 | 0 | 0 | 0 |
| | Second upper cladding layer (109) | Material | - | ITO | ITO | ITO | - | ITO |
| | | Refractive index | - | 2.02 | 2.02 | 2.02 | - | 2.02 |
| | | Thickness | - | 0.2 μm | 0.2 μm | 0.2 μm | - | 0.2 μm |
| | | Extinction coefficient | - | 0.01 | 0.01 | 0.01 | - | 0.01 |
| Characteristics (calculation result) | Light confinement coefficient $\Gamma_v$ [%] | | 3.42 | 3.73 | 3.38 | 3.69 | 3.68 | 3.69 |
| | Waveguide loss $\alpha_i$ [cm$^{-1}$] | | 3.5 | 15.3 | 6.9 | 3.5 | 35.6 | 3.5 |

Film thickness of second upper cladding layer (ITO) [nm]

FIG. 9

| | | Structure G | Structure H | Structure I | Structure J | Structure K | Structure L |
|---|---|---|---|---|---|---|---|
| Parameters for caluculation | Optical waveguide (220) Width | 1.5 μm | | | | | |
| | Length | 800 μm | | | | | |
| | Lower cladding layer (202) Material | $Al_{0.05}Ga_{0.95}N$ | | | | | |
| | Lower guide layer (203) Material | InGaN | | | | | |
| | Quantum well active layer (204) Emission wavelength | InGaN/GaN multiple quantum well | | | | | |
| | | 450 nm | | | | | |
| | Upper guide layer (205) Material | InGaN | | | | | |
| | Thickness | 0.1 μm | | | | | |
| | First upper cladding layer (208) Material | $Al_{0.05}Ga_{0.95}N$ | - | GaN | $Al_{0.05}Ga_{0.95}N$ | $Al_{0.05}Ga_{0.95}N$ | $Al_{0.2}In_{0.1}Ga_{0.7}N$ |
| | Refractive index | 2.50 | - | 2.53 | 2.50 | 2.50 | 2.50 |
| | Thickness | 0.45 μm | - | 0.15 μm | 0.15 μm | 0.15 μm | 0.15 μm |
| | Extinction coefficient | 0 | - | 0 | 0 | 0 | 0 |
| | Second upper cladding layer (209) Material | - | ITO | ITO | ITO | - | ITO |
| | Refractive index | - | 2.02 | 2.02 | 2.02 | - | 2.02 |
| | Thickness | - | 0.2 μm | 0.2 μm | 0.2 μm | - | 0.2 μm |
| | Extinction coefficient | - | 0.01 | 0.01 | 0.01 | - | 0.01 |
| Characteristics (calculation result) | Light confinement coefficient $\Gamma_V$ [%] | 2.46 | 2.67 | 2.24 | 2.59 | 2.56 | 2.59 |
| | Waveguide loss $\alpha_i$ [cm$^{-1}$] | 3.6 | 6.4 | 6.8 | 2.2 | 31.1 | 2.2 |

NITRIDE SEMICONDUCTOR LIGHT-EMITTING DEVICE

CROSS REFERENCE TO RELATED APPLICATION

This is a continuation application of PCT International Application No. PCT/JP2012/001144 filed on Feb. 21, 2012, designating the United States of America, which is based on and claims priority of Japanese Patent Application No. 2011-066507 filed on Mar. 24, 2011. The entire disclosures of the above-identified applications, including the specifications, drawings and claims are incorporated herein by reference in their entirety.

FIELD

The present disclosure relates to a nitride semiconductor light-emitting device and particularly relates to a nitride semiconductor light-emitting device which provides high light emission efficiency and works at low operating voltage.

BACKGROUND

An III-V group nitride compound semiconductor typified by gallium nitride (GaN), so-called a nitride semiconductor, has been attracting attention. The nitride semiconductor is expressed by the following general expression: $In_xGa_yAl_{1-x-y}N$ ($0 \leq x \leq 1$, $0 \leq y \leq 1$, $x+y \leq 1$), and is a compound semiconductor comprising: at least one of indium (In), gallium (Ga), and aluminum (Al) included in group-III elements; and nitrogen (N) included in group-V elements. In the field of devices using such a nitride semiconductor, especially light-emitting devices which convert electricity into light are developed actively.

There are roughly two kinds of semiconductor light-emitting devices. One is a light emitting diode (LED) which converts injected carriers (electrons, holes) into light through spontaneous emission. The other is a semiconductor laser, such as a laser diode (LD), in which a waveguide is provided in the device and carriers injected in the waveguide are converted into light through stimulated emission.

A light-emitting diode using the nitride semiconductor has been developed actively as a white LED combined with phosphor for a backlight light-source of a lighting apparatus and a liquid crystal display apparatus. In contrast, regarding a semiconductor laser using the nitride semiconductor, a blue-violet laser diode which emits laser beam having an emission wavelength of 400 nm to 410 nm is used as a light-source of a record and reproduction apparatus for blu-ray discs.

Furthermore, in recent years, a nitride semiconductor light-emitting device in which emission wavelength is elongated from a blue region to a green region has also been developed and manufactured as a light-source for a display. For this purpose, a nitride semiconductor light-emitting device which emits light capable of reducing speckle noise that is a disadvantage of laser beam, such as a super luminescent diode (SLD), has also been developed.

The nitride semiconductor light-emitting device such as the semiconductor laser or the SLD realizes a high efficiency light-emitting device, by generating stimulated emission light in the optical waveguide as described above. To obtain the stimulated emission light efficiently, it is required to increase a light confinement coefficient of the optical waveguide. As a scheme for increasing the light confinement coefficient, in the conventional technique for example, a scheme can be raised in which GaN is used as a guide layer and $Al_xGa_{1-x}N$ ($0<x \leq 1$) is used as a cladding layer. In this case, it is possible to increase the light confinement coefficient by increasing Al composition in $Al_xGa_{1-x}N$ in the cladding layer which significantly reduces the refractive index than that of GaN in the guide layer, thereby increasing a difference in the refractive indexes.

However, increasing the Al composition in the cladding layer entails side effects. Particularly, in a p-type cladding layer provided above a light emitting layer, ionization energy of an Mg acceptor used as dopant increases in proportion to the Al composition. Therefore, there is a problem in that it becomes difficult to realize a high hole-concentration in the p-type cladding layer, which causes an increase in a series resistance in the cladding layer and an increase in the operating voltage of the nitride semiconductor light-emitting device.

In order to solve the above problem, Patent Literature (PTL) 1 discloses a laser diode which is said to be able to realize high light confinement while realizing low operating voltage. The following describes the structure of the conventional laser diode disclosed in PTL 1, with reference to FIG. 17.

As shown in FIG. 17, a conventional laser diode 2100 includes: a substrate 2101 comprising, e.g., sapphire substrate; and an n-type contact layer 2110, an n-type lower cladding layer 2130, an n-type lower waveguide layer 2140, a multiple quantum well (MQW) region 2150, a p-type confinement layer 2160, and a p-type upper waveguide layer 2170, formed above the substrate 2101.

Furthermore, an upper cladding layer 2180 comprising a transparent conductive film is formed on the upper waveguide layer 2170 and located over an active region 2155 of the MQW region 2150. Moreover, a pair of isolation layer portions 2185 is formed on opposite sides of the upper cladding layer 2180.

Furthermore, a p-side electrode 2190 comprising metal is formed on the upper cladding layer 2180 and the isolation layer portions 2185. In contrast, an n-side electrode 2120 comprising metal is formed on a first exposed region of the n-type contact layer 2110.

CITATION LIST

Patent Literature

[PTL 1] Japanese Unexamined Patent Application Publication No. 2004-289157

SUMMARY

Technical Problem

However, when the Applicants of the present application made and examined the laser diode 2100 configured as above, the Applicants have found that with the structure of the conventional laser diode 2100, a desired light output cannot be obtained since the laser diode 2100 does not cause stimulated emission by an injected current within the range of use, though the laser diode 2100 does lower the operating voltage.

This is because it is difficult to manufacture a high-crystallinity transparent conductive film which has sufficiently low bulk resistivity and small light absorption of the emitted light, even when indium tin oxide (ITO), which has the most stable characteristics at present, is used as a material for a transparent conductive film of the upper cladding layer 2180.

As described above, since it is difficult to increase the crystallinity of the transparent conductive film, there is a problem in that, even when the laser diode 2100 having the structure shown in FIG. 17 is manufactured, the light emission efficiency decreases because of an internal loss caused by the light absorption at the interface between the p-type upper waveguide layer 2170 and the upper cladding layer 2180 comprising the transparent conductive film.

The present disclosure has been conceived in view of the above aspects, and one non-limiting and explanatory embodiment provides a nitride semiconductor light-emitting device which can realize a high light-emission efficiency and low operating voltage.

Solution to Problem

An aspect of the nitride semiconductor light-emitting device according to the present disclosure is a nitride semiconductor light-emitting device having an optical waveguide, the nitride semiconductor light-emitting device including, in the following order, at least: a first cladding layer; an active layer; and a second cladding layer, wherein the second cladding layer includes (i) a transparent conductive layer comprising a transparent conductor and (ii) a nitride semiconductor layer comprising a nitride semiconductor, the nitride semiconductor layer being formed closer to the active layer than the transparent conductive layer.

With this configuration, the nitride semiconductor layer located closer to the active layer out of the second cladding layers can confine light. Thus, even when the transparent conductive layer comprises a transparent conducting oxide film having a low crystallinity, it is possible to prevent the increase of the internal loss as compared to the nitride semiconductor light-emitting device which confines light with a single transparent conductive layer. As a result, a nitride semiconductor light-emitting device with high light-emission efficiency can be realized.

Furthermore, the transparent conductive layer included in the second cladding layer contributes to the light confinement in a longitudinal direction. Thus, it is possible to make the nitride semiconductor layer formed closer to the active layer thinner, which reduces a series resistance in the nitride semiconductor layer. As a result, a nitride semiconductor light-emitting device which can work with a low operating voltage can be realized.

Furthermore, in an aspect of the nitride semiconductor light-emitting device according to the present disclosure, the nitride semiconductor layer comprises at least aluminum, for example.

Furthermore, in an aspect of the nitride semiconductor light-emitting device according to the present disclosure, the nitride semiconductor layer comprises $Al_xIn_yGa_{1-x-y}N$, where $0<x\leq0.82$, $0\leq y\leq0.18$, and $0\leq1-x-y<1$, for example.

Furthermore, in an aspect of the nitride semiconductor light-emitting device according to the present disclosure, the nitride semiconductor light-emitting device further includes a guide layer formed between the active layer and the second cladding layer, wherein a total film thickness d of the guide layer and the second cladding layer satisfies $0.1\ \mu m<d<0.5\ \mu m$, for example.

Furthermore, in an aspect of the nitride semiconductor light-emitting device according to the present disclosure, the optical waveguide has a vertical mesa structure formed by digging from the second cladding layer to part of the first cladding layer, for example.

Furthermore, in an aspect of the nitride semiconductor light-emitting device according to the present disclosure, a material of the transparent conductor is one of tin-added indium oxide, antimony-added tin oxide, and zinc oxide, for example.

Furthermore, in an aspect of the nitride semiconductor light-emitting device according to the present disclosure, the transparent conductive layer has a film thickness greater than 100 nm, for example.

Advantageous Effects

With the nitride semiconductor light-emitting device according to the present disclosure, a nitride semiconductor light-emitting device with a high light-emission efficiency and low operating voltage can be realized.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 is a comparison table which shows parameters for calculation and characteristics of six kinds of nitride semiconductor light-emitting devices each having a different structure.

FIG. 9 is a comparison table which shows parameters for calculation and characteristics of six kinds of nitride semiconductor light-emitting devices each having a different structure.

DESCRIPTION OF EMBODIMENTS

The following describes embodiments of the nitride semiconductor light-emitting device according to the present disclosure with reference to the Drawings. It is to be noted that the following embodiments are an example, and therefore the present disclosure is determined not by these embodiments but by the recitation in the Claims. Therefore, among constituent elements in the embodiments below, constituent elements not recited in the Claims are not necessary for solving the problem, and are described as constituent elements comprising more favorable embodiments. It is to be noted that each of the drawings is a schematic view and does not necessarily illustrate the real situation.

Embodiment 1

First, a nitride semiconductor light-emitting device 100 according to Embodiment 1 is described with reference to the Drawings. The nitride semiconductor light-emitting device 100 according to the present embodiment is a laser diode using a nitride semiconductor and has a emission wavelength of 390 nm to 420 nm and a center wavelength of 405 nm, for example.

Figure 1A:
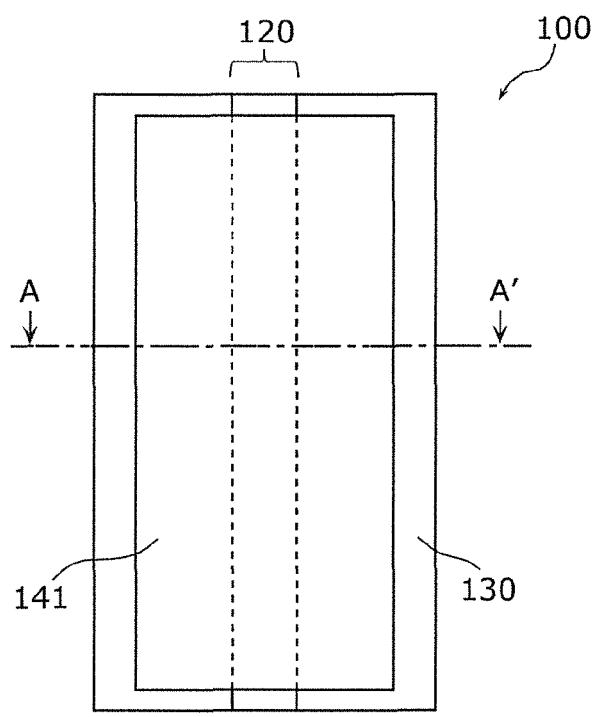
FIG. 1A is a top view of a nitride semiconductor light-emitting device according to Embodiment 1.
Figure 1B:
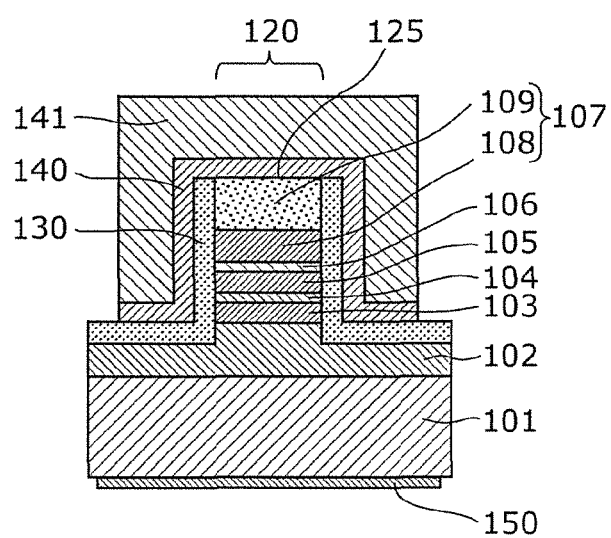
FIG. 1B is a sectional view, at an A-A' line in FIG. 1A, of the nitride semiconductor light-emitting device according to Embodiment 1.

FIG. 1A is a top view of the nitride semiconductor light-emitting device according to Embodiment 1. FIG. 1B is a sectional view, at the A-A' line in FIG. 1A, of the nitride semiconductor light-emitting device.

As shown in FIG. 1A and FIG. 1B, the nitride semiconductor light-emitting device 100 according to Embodiment 1 has a layer structure which includes: a substrate 101 which is, e.g., an n-type GaN bulk substrate of the (0001) face; and a lower cladding layer 102 (first cladding layer) which is, e.g., an n-type $Al_xGa_{1-x}N$ (0≤x≤1) layer, a lower guide layer 103 (first guide layer) which is, e.g., an n-type GaN layer, an active layer 104 having a quantum well structure and is, e.g., an InGaN active layer, an upper guide layer 105 (second guide layer) which is, e.g., a p-type GaN layer, an electronic barrier layer 106 which is, e.g., a thin-film p-type $Al_xGa_{1-x}N$ (0≤x≤1) layer, and an upper cladding layer 107 (second cladding layer), layered sequentially above the substrate 101.

The upper cladding layer 107 includes a plurality of layers and, in the present embodiment, has a double-layered structure of a first upper cladding layer 108 and a second upper cladding layer 109.

The first upper cladding layer 108 comprises a nitride semiconductor, and is a nitride semiconductor cladding layer (nitride semiconductor layer) formed closer to the active layer 104 than the second upper cladding layer 109. The first upper cladding layer 108 may comprise, for example, p-type $Al_{x+y}In_{1-y}Ga_{1-x}N$ (0<x≤0.82, 0≤y≤0.18, and 0≤1−x−y<1).

The second upper cladding layer 109 comprises a transparent conductive film (transparent conductor), and is a transparent conductor cladding layer (transparent conductive layer) formed farther from the active layer 104 than the first upper cladding layer 108. The second upper cladding layer 109 may comprise ITO, for example.

The nitride semiconductor light-emitting device 100 according to the present embodiment includes a ridge-shaped optical waveguide 120 which has a ridge (protruding portion) formed by deeply digging the nitride semiconductor light-emitting device 100 to a layer lower than the active layer 104 by etching. The optical waveguide 120 in the present embodiment has a vertical mesa structure formed by deeply digging from the second upper cladding layer 109 to part of the lower cladding layer 102.

On a top face of the lower cladding layer 102 and on lateral faces of the ridge of the optical waveguide 120, an insulating film 130 comprising $SiO_2$ is formed. Furthermore, a p-side electrode 140 is formed on the insulating film 130 and a top face of the second upper cladding layer 109 (a contact face 125 of the protruding portion of the optical waveguide 120), to cover the lower cladding layer 102 and the ridge of the optical waveguide 120. Furthermore, a pad electrode 141 is formed to cover the p-side electrode 140. Moreover, on a reverse face of the substrate 101, that is, on a face opposite to the face on which the lower cladding layer 102 is formed, an n-side electrode 150 is formed.

By providing the first upper cladding layer 108 comprising the nitride semiconductor immediately under the second upper cladding layer 109 comprising the transparent conductive film in the upper cladding layer 107 in this manner, a difference is caused between the refractive index of the first upper cladding layer 108 and the refractive index of the upper guide layer 105 formed below the first upper cladding layer 108 and comprising p-type GaN. Specifically, the first upper cladding layer 108 formed closer to the active layer 104 can confine light. Thus, increase of the internal loss (αi) caused by light absorption can be suppressed even when the second upper cladding layer 109 comprises a transparent conducting oxide film having low crystallinity and therefore an extinction coefficient is high. As a result, a nitride semiconductor light-emitting device with high light-emission efficiency can be realized.

Furthermore, the second upper cladding layer 109 comprising the transparent conductive film serves also as a cladding layer which confines light and carriers, and therefore the second upper cladding layer 109 can confine light in the longitudinal direction. Thus, the film thickness of the first upper cladding layer 108 comprising p-type $Al_{x+y}In_{1-y}Ga_{1-x}N$ can be thinner, and therefore the series resistance of the first upper cladding layer 108 can be reduced. As a result, a nitride semiconductor light-emitting device with a low operating voltage can be realized.

As described above, with the nitride semiconductor light-emitting device 100 according to Embodiment 1, a nitride semiconductor light-emitting device with high light-emission efficiency and low operating voltage can be realized.

Figure 2:
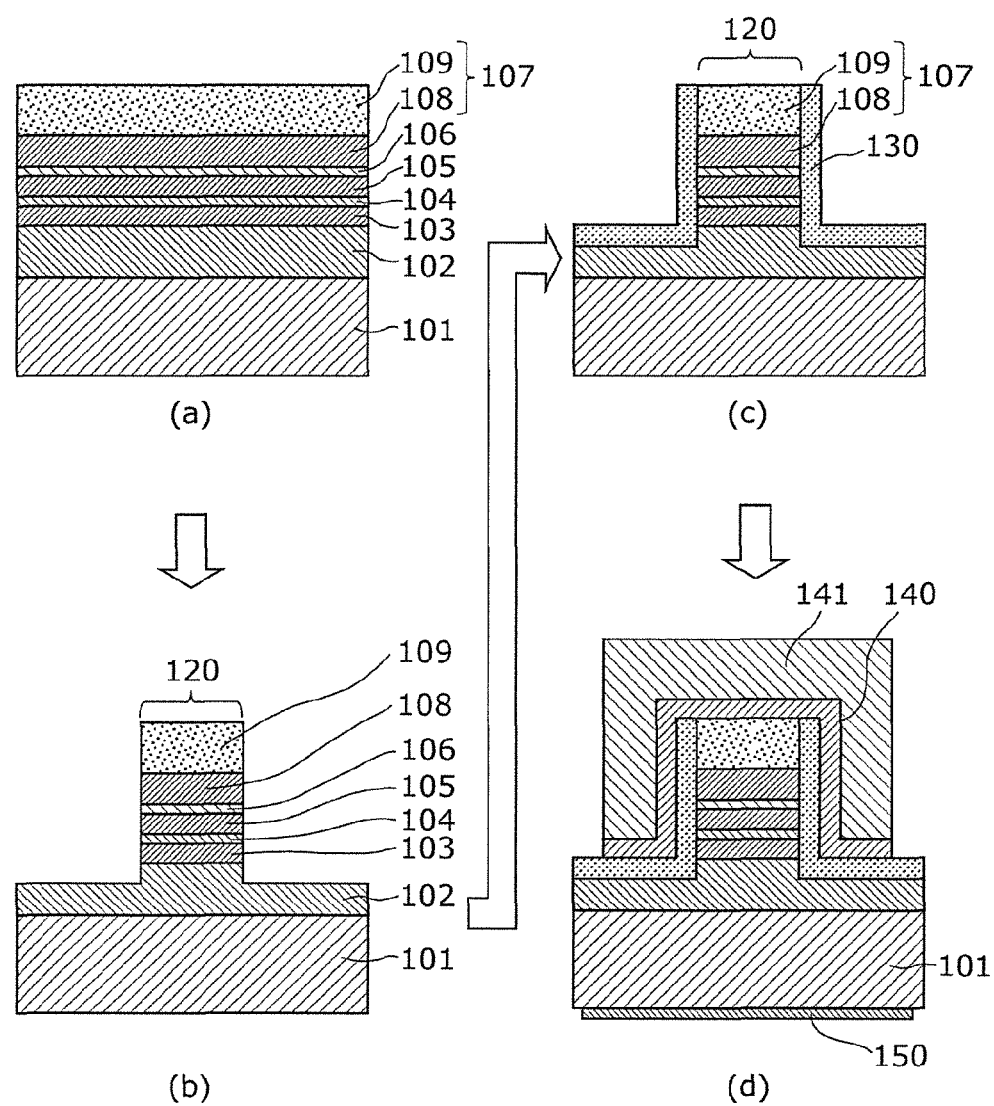
FIG. 2 is a diagram showing a method for manufacturing the nitride semiconductor light-emitting device according to Embodiment 1.

Next, a method for manufacturing the nitride semiconductor light-emitting device 100 according to Embodiment 1 is described with reference to FIG. 2. FIG. 2 is a diagram showing the method for manufacturing the nitride semiconductor light-emitting device according to Embodiment 1.

As shown in (a) in FIG. 2, first, on the substrate 101, the lower cladding layer 102 is formed by forming, e.g., Si-doped $Al_{0.05}Ga_{0.95}N$ to have a film thickness of 1.5 μm by metal organic chemical vapor deposition (MOCVD). Then, the following are formed sequentially: the lower guide layer 103 which is, e.g., Si-doped n-type GaN; an active layer 104 in which, e.g., a plurality of $In_{0.6}Ga_{0.94}N$ well layer/$In_{0.02}Ga_{0.98}N$ barrier layer are formed (e.g., three layers); the upper guide layer 105 (film thickness: 100 nm) which is, e.g., Mg-doped GaN; and the electronic barrier layer 106 (film thickness: 10 nm) which is, e.g., Mg-doped p-type $Al_{0.2}Ga_{0.8}N$.

After that, as the upper cladding layer 107, a layered film of the nitride semiconductor layer and the transparent conductive layer is formed. Specifically, on the electronic barrier layer 106, the first upper cladding layer 108 which is the nitride semiconductor layer is formed by forming, e.g., Mg-doped p-type $Al_{0.05}Ga_{0.95}N$ to have a film thickness of 150 nm. After that, the above is taken out from the growth chamber, and the second upper cladding layer 109 which is the transparent conductive layer is formed by forming, e.g., ITO to have a film thickness of 200 nm by a sputtering apparatus or an electron beam (EB) vapor deposition apparatus.

Next, on the second upper cladding layer 109, a $SiO_2$ film having a thickness of 800 nm is formed by plasma CVD. After that, the $SiO_2$ film is selectively removed by photolithography and etching using hydrofluoric acid, and then a $SiO_2$ mask is formed which has a width of, for example, 1.5 μm and is to be the ridge-shaped optical waveguide 120. After that, dry etching is performed using $Cl_2$ gas, and the area not covered with the $SiO_2$ mask is etched to (part or all of) the lower cladding layer 120. Thus, as shown in (b) in FIG. 2, the protruding (ridge) pattern having the width of 1.5 μm is formed.

Next, the insulating film 130 is formed by forming the $SiO_2$ film having a thickness of 300 nm to cover the entire face above the substrate 101, by plasma CVD. After that, by removing the $SiO_2$ mask, the ridge-shaped optical waveguide 120 having the double-layered upper cladding layer 107 is formed as shown in (c) in FIG. 2.

Next, as shown in (d) in FIG. 2, the p-side electrode 140, which comprises palladium (Pd) having a thickness of 45 nm and platinum (Pt) having a thickness of 50 nm, is formed to cover the optical waveguide 120, by the photolithography and EB vapor deposition. Then, the pad electrode 141 is formed by forming a film by layering titanium (Ti) having a thickness of 50 nm and gold (Au) having a thickness of 1000 nm by the photolithography and EB vapor deposition, and then increasing the thickness of Au to 10 μm by electroplating.

After that, the thickness of the substrate 101 is reduced to approximately 100 μm by polishing using diamond slurry, and then, on the reverse face of the substrate 101, the following are formed by the EB vapor deposition apparatus as the n-side electrode 150: Ti having a thickness of 5 nm, Pt having a thickness of 10 nm, and Au having a thickness of 1000 nm. After that, the above is cleaved in bars and divided into chips. This is how the nitride semiconductor light-emitting device 100 according to the present embodiment is manufactured.

Here, with reference to FIG. 3, description is provided on the reason why the upper cladding layer 107 has the double-layered structure including: the first upper cladding layer 108 comprising the nitride semiconductor and formed closer to the active layer 104; and the second upper cladding layer 109 comprising the transparent conductor and formed on the first upper cladding layer 108.

FIG. 3 is a comparison table which shows parameters for calculation and characteristics of six kinds of nitride semiconductor light-emitting devices ("structure A" to "structure F") each having a different structure. It is to be noted that conditions for the nitride semiconductor light-emitting device of each structure in FIG. 3 are set by corresponding each layer of the structure with each layer of the nitride semiconductor light-emitting device shown in FIG. 1B.

The "structure A" is a structure in which only $Al_{0.05}Ga_{0.95}N$ is used as the upper cladding layer 107 and the transparent conductive layer is not provided. The "structure A" is the standard structure. The "structure B" is a structure in which the first upper cladding layer (nitride semiconductor layer) 108 is not provided and only the second upper cladding layer 109 comprising ITO is provided. The "structure C" is a structure in which GaN is used as the material for the first upper cladding layer 108 and ITO is used as the material for the second upper cladding layer 109. The "structure D" is a structure in which $Al_{0.05}Ga_{0.95}N$ is used as the material for the first upper cladding layer 108 and ITO is used as the material for the second upper cladding layer 109. The "structure E" does not include the transparent conductive layer, in the same manner as the "structure A". However, the "structure E" is a structure in which the film thickness of the upper cladding layer 107 is thin, $Al_{0.05}Ga_{0.95}N$ is used as the material for the first upper cladding layer 108, and the second upper cladding layer 109 is not provided. The "structure F" is a structure in which $Al_{0.2}In_{0.1}Ga_{0.7}N$ is used as the material for the first upper cladding layer 108 and ITO is used as the material for the second upper cladding layer 109.

It is to be noted that, out of the six kinds of structures shown in FIG. 3, the nitride semiconductor light-emitting device 100 according to Embodiment 1 is the structure D and the structure F. The structure D does not include indium (In) in the first upper cladding layer 108.

FIG. 3 shows, for each of the six kinds of nitride semiconductor light-emitting devices, values of the light confinement coefficient (Γ) and the waveguide loss (αi) which determine the current-light-output characteristics.

As shown in the result in FIG. 3, with the nitride semiconductor light-emitting device of the structure D and the structure F which are the structures according to the present embodiment, a higher light confinement coefficient can be obtained than the nitride semiconductor light-emitting device of the structure A, which is the standard laser structure, while obtaining the waveguide loss at the same level as that of the structure A. As a result, with the nitride semiconductor light-emitting device 100 according to the present embodiment, the current-voltage characteristics can be improved without reducing the current-light output characteristics, as compared with the nitride semiconductor light-emitting device of the standard structure A.

Figure 4A:
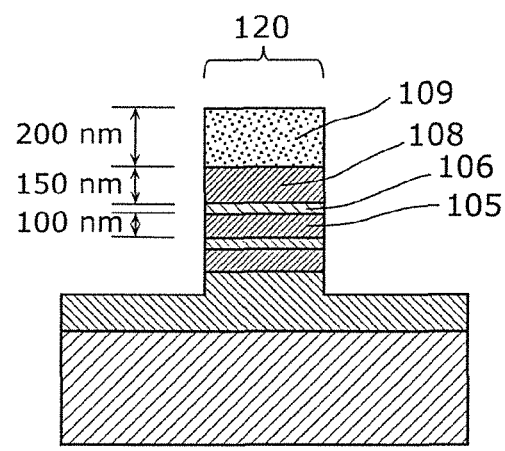
FIG. 4A shows a structure for illustrating a design example of a second upper cladding layer of the nitride semiconductor light-emitting device according to Embodiment 1.
Figure 4B:
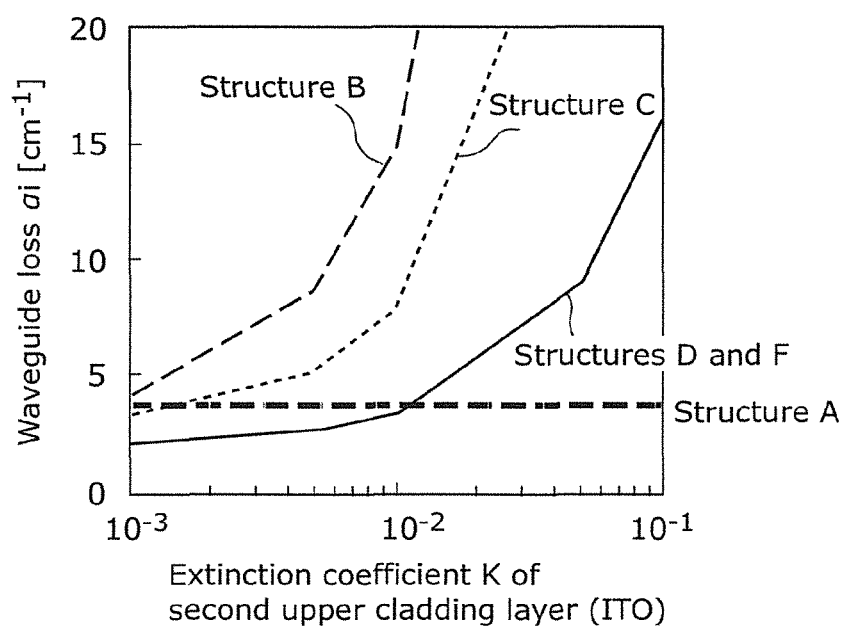
FIG. 4B shows a relationship between an extinction coefficient (K) of ITO and waveguide loss ($\alpha i$) when the structure shown in FIG. 4A is adopted.

Next, regarding the above "structure A" to "structure F" (except "structure E"), description is provided on a relationship between characteristics of the ITO which is the material for the upper cladding layer 109 and characteristics of the nitride semiconductor light-emitting device, with reference to FIG. 4A and FIG. 4B. FIG. 4A shows a structure of the nitride semiconductor light-emitting device used for illustrating a design example of the second upper cladding layer 109. FIG. 4B shows a relationship between an extinction coefficient (K) of ITO and the waveguide loss ($\alpha i$) when the structure shown in FIG. 4A is used. FIG. 4B shows dependency of the extinction coefficient (K) of ITO on the waveguide loss.

As shown in FIG. 4B, to suppress the waveguide loss of the nitride semiconductor light-emitting device of the "structure B" or "structure C" to the same level as that of the nitride semiconductor light-emitting device of the "structure A", "structure D", and "structure F", it is sufficient to reduce the extinction coefficient (K) of the second upper cladding layer 109 (ITO) to approximately $10^{-3}$ which requires an increase in the crystallinity of the ITO. However, under present circumstances, it is almost impossible to form the ITO having such a high crystallinity level.

In contrast, with the nitride semiconductor light-emitting device of the "structure D" and "structure F", the waveguide loss ($\alpha i$) can be suppressed at the same level as that of the "structure A", even when the extinction coefficient (K) of the second upper cladding layer 109 (ITO) is $10^{-2}$ which is relatively great. Specifically, even when the second upper cladding layer 109 is the ITO having a low crystallinity, the waveguide loss ($\alpha i$) at the same level as that of the nitride semiconductor light-emitting device of the "structure A" can be obtained. This is because, in the nitride semiconductor light-emitting device of the "structure D" and "structure F", the first upper cladding layer 108 which comprises AlGaN having a low refractive index contributes to light confinement and therefore almost no light exudes to the second upper cladding layer 109.

As described above, with the nitride semiconductor light-emitting device 100 according to the present embodiment, it is possible to suppress the increase of the waveguide loss ($\alpha i$) caused by light absorption, even when the second upper cladding layer 109 is the ITO having low crystallinity. Furthermore, the second upper cladding layer 109 comprising ITO has a lower refractive index than that of the first upper cladding layer 108 comprising p-type AlGaN. Therefore, the second upper cladding layer 109 serves also as the light confinement layer. This makes it possible to make the film thickness of the first upper cladding layer 108 thinner, thereby reducing the series resistance. Accordingly, a nitride semiconductor light-emitting device with high light-emission efficiency and low operating voltage can be realized.

Figure 5A:
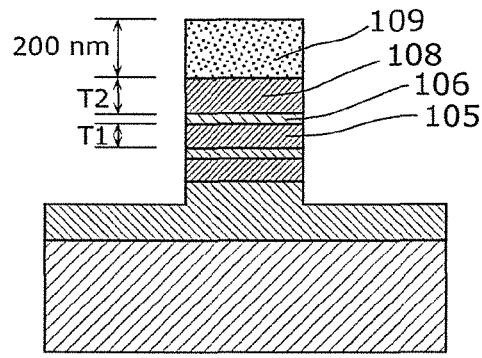
FIG. 5A shows a structure for illustrating a design example of an upper guide layer and a first upper cladding layer of the nitride semiconductor light-emitting device according to Embodiment 1.
Figure 5B:
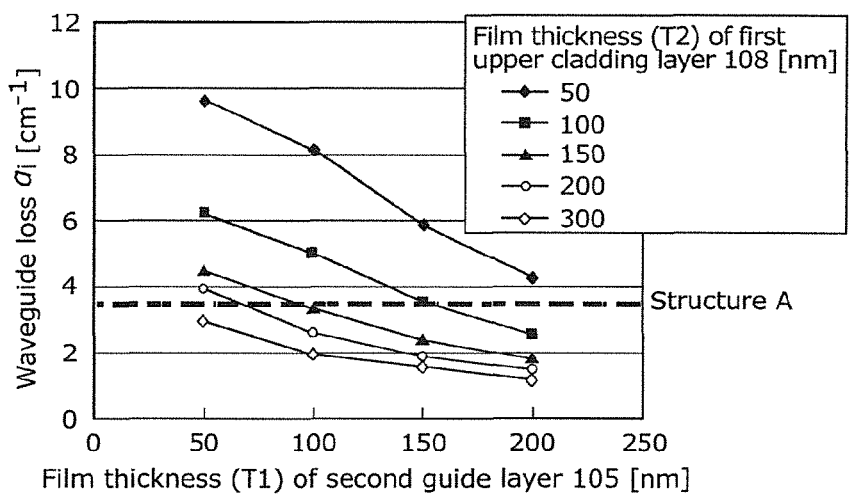
FIG. 5B shows a relationship between: film thicknesses of a second guide layer and the first upper cladding layer; and waveguide loss, in the nitride semiconductor light-emitting device shown in FIG. 5A.
Figure 5C:
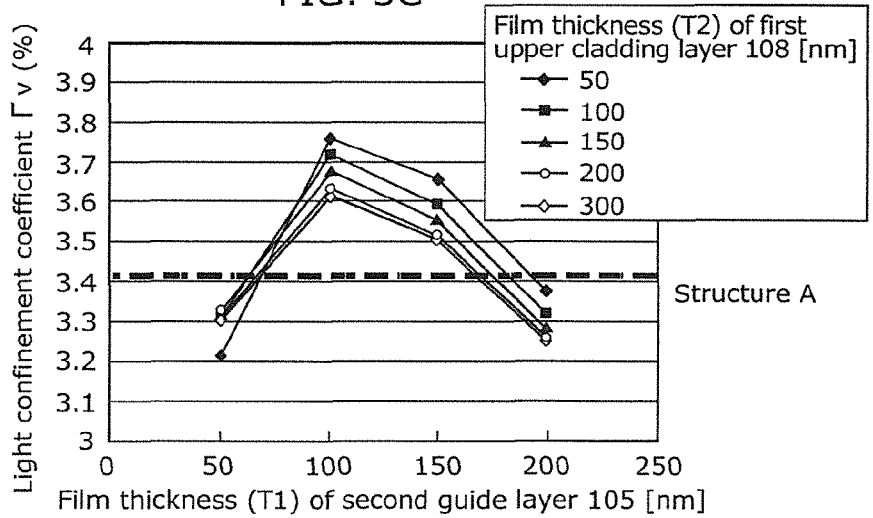
FIG. 5C shows a relationship between: the film thicknesses of the second guide layer and the first upper cladding layer; and a light confinement coefficient, in the nitride semiconductor light-emitting device shown in FIG. 5A.

Next, description is provided on an example of the film thickness of the upper guide layer 105 of the nitride semiconductor light-emitting device 100 according to the present embodiment, with reference to FIG. 5A, FIG. 5B, and FIG. 5C.

FIG. 5A shows the structure of the nitride semiconductor light-emitting device used for illustrating a design example of the upper guide layer 105 and the first upper cladding layer 108. FIG. 5B shows a relationship between: the film thicknesses of the second guide layer and the first upper cladding layer; and the waveguide loss, in the nitride semiconductor light-emitting device shown in FIG. 5A. FIG. 5C shows a relationship between: the film thicknesses of the second guide layer and the first upper cladding layer; and the light confinement coefficient, in the nitride semiconductor light-emitting device shown in FIG. 5A.

In the above structure, the film thickness of the p-type GaN which is the upper guide layer 105 is set to 100 nm, the film thickness of the p-type AlGaN which is the first upper cladding layer 108 is set to 150 nm, and the film thickness of the second upper cladding layer 109 is set to 200 nm.

Here, the light confinement coefficient ($\Gamma$) and waveguide loss ($\alpha i$) are determined based on the film thickness (T1) of the p-type GaN which is the upper guide layer 105, and the film thickness (T2) of the p-type AlGaN which is the first upper cladding layer 108.

Therefore, there are cases where the advantageous effects of the above nitride semiconductor light-emitting device according to the present embodiment cannot be produced sufficiently, depending on the film thicknesses of the p-type GaN which is the upper guide layer 105 and the p-type AlGaN which is the first upper cladding layer 108.

Therefore, as shown in the structure shown in FIG. 5A, the film thickness of the upper guide layer 105 comprising p-type GaN is set to T1 and the film thickness of the first upper cladding layer 108 comprising p-type AlGaN is set to T2, and the light confinement coefficient ($\Gamma$) and waveguide loss ($\alpha i$) with respect to the change in the film thickness is calculated. The calculation result is shown in FIG. 5B and FIG. 5C.

As shown in FIG. 5B and FIG. 5C, to obtain the nitride semiconductor light-emitting device realizing the higher light confinement coefficient and the lower waveguide loss than those of the structure A (light confinement coefficient: 3.4% and waveguide loss: 3.5 cm$^{-1}$), the film thickness (T2) of the first upper cladding layer 108 may be greater than or equal to 150 nm when the film thickness (T1) of the upper guide layer 105 is 100 nm, for example.

Likewise, when the film thickness (T1) of the upper guide layer 105 is 150 nm, the film thickness (T2) of the first upper cladding layer 108 may be greater than or equal to 100 nm, for example.

Using a combination of the film thickness (T1) of the upper guide layer 105 and the film thickness (T2) of the first upper cladding layer 108 within the range shown in FIG. 5B and FIG. 5C allows suppressing the increase of the waveguide loss ($\alpha i$) and obtaining the desired light confinement coefficient even when the extinction coefficient of the ITO is great.

It is to be noted that when the film thickness (T1) of the upper guide layer 105 is set to be smaller than 100 nm or greater than 150 nm, the waveguide loss ($\alpha i$) becomes greater than that of the standard structure A and the light confinement coefficient decreases, thereby causing an increase in threshold current characteristics.

Figure 6:
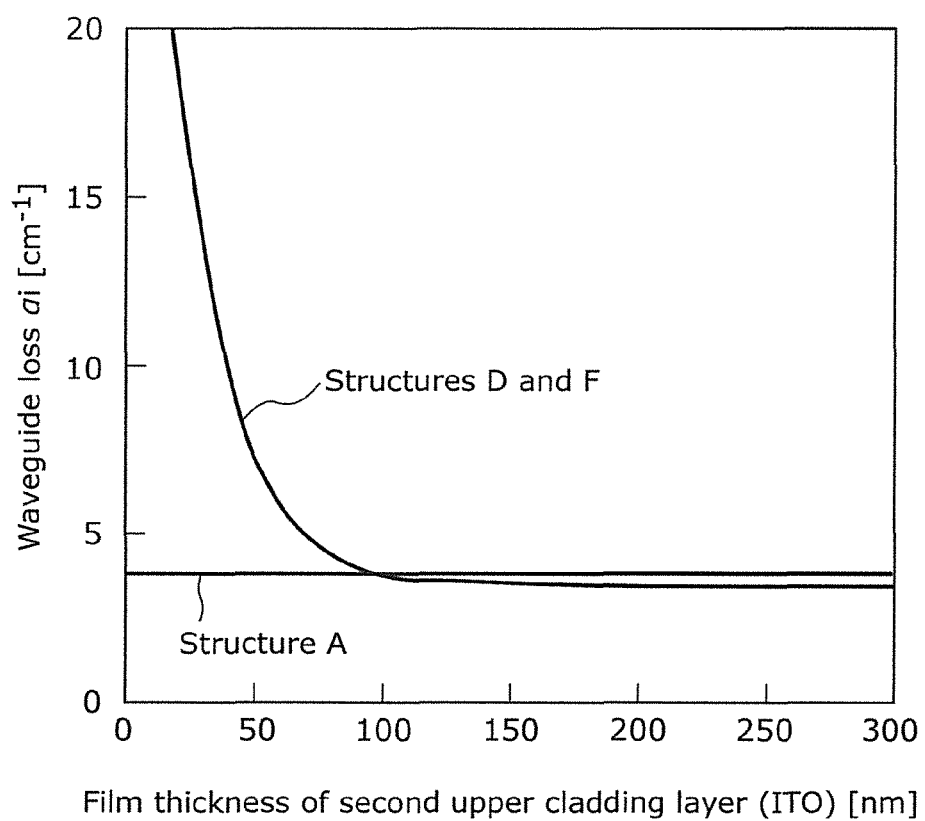
FIG. 6 shows a relationship between the film thickness of the second upper cladding layer and waveguide loss in the nitride semiconductor light-emitting device according to Embodiment 1.

Next, description is provided on an example of the film thickness of the second upper cladding layer 109 of the nitride semiconductor light-emitting device 100 according to the present embodiment with reference to FIG. 6. FIG. 6 shows a relationship between the film thickness of the second upper cladding layer and the waveguide loss in the nitride semiconductor light-emitting device according to Embodiment 1.

Although the film thickness of the second upper cladding layer 109 (ITO) is set to 200 nm in the above structure, to obtain the same level of the waveguide loss as that of the standard structure A (waveguide loss: 3.5 cm$^{-1}$) with the structure D or the structure F which is the structure of the present embodiment, at least the film thickness of the second upper cladding layer 109 may be greater than or equal to 100 nm as shown in FIG. 6, for example. Thus, the light absorption by the electrode on the contact face of the second upper cladding layer 109 can be sufficiently reduced.

The above result of the calculation on the film thickness shows that the total film thickness d of the upper guide layer 105 and the upper cladding layer 107 (the first upper cladding layer 108 and the second upper cladding layer 109) may be 0.1 μm<d<0.5 μm, for example.

The foregoing is the description on the present embodiment focusing on the case where the p-type AlGaN is used as the first upper cladding layer 108. In this case, the advantageous effects of the present embodiment can be produced when the first upper cladding layer 108 is the nitride semiconductor comprising at least Al. An example of the Al composition of the first upper cladding layer 108 is $0 \leq x \leq 0.1$. When the Al composition x is greater than 0.1, the series resistance of the first upper cladding layer 108 increases which deteriorates the threshold current characteristics, and a difference between the lattice constant of AlGaN and that of GaN increases which causes cracks and affects the yield.

Furthermore, as the material for the first upper cladding layer 108, not only AlGaN but also p-type AlInN which has a lower refractive index than when the Al composition x of AlGaN is $0<x \leq 0.1$ or a p-type AlInGaN which is four-element mixed crystal may be used to produce the same advantageous effects.

Embodiment 2

Next, a nitride semiconductor light-emitting device 200 according to Embodiment 2 is described with reference to the Drawings.

In the above-described nitride semiconductor light-emitting device 100 according to Embodiment 1, GaN is used as the material for the lower guide layer 103 and the upper guide layer 105. In contrast, InGaN is used as the material for the lower guide layer 203 and the upper guide layer 205 in Embodiment 2. This allows the nitride semiconductor light-emitting device 200 according to Embodiment 2 to further increase an acceptable upper limit for the extinction coefficient of ITO and to increase the light confinement coefficient, as compared with the nitride semiconductor light-emitting device 100 according to Embodiment 1. Accordingly, a nitride semiconductor light-emitting device with higher light-emission efficiency can be realized.

For the nitride semiconductor light-emitting device according to Embodiment 2, description is provided by taking a super luminescent diode comprising a nitride semiconductor as an example. The nitride semiconductor light-emitting device according to the present embodiment has the emission wavelength of 420 nm to 490 nm and the center wavelength is 450 nm, for example.

Figure 7A:
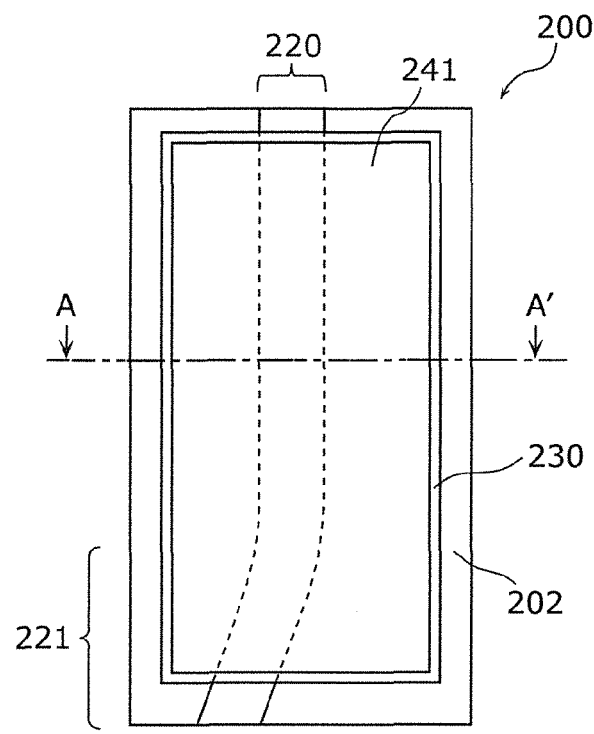
FIG. 7A is a top view of a nitride semiconductor light-emitting device according to Embodiment 2.
Figure 7B:
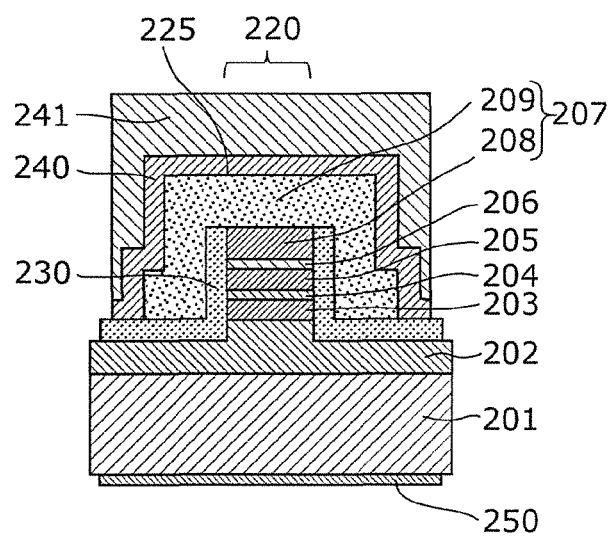
FIG. 7B is a sectional view, at an A-A' line in FIG. 7A, of the nitride semiconductor light-emitting device according to Embodiment 2.

FIG. 7A is a top view of the nitride semiconductor light-emitting device according to Embodiment 2. FIG. 7B is a sectional view, at the A-A' line in FIG. 7A, of the nitride semiconductor light-emitting device.

As shown in FIG. 7A and FIG. 7B, the nitride semiconductor light-emitting device 200 according to Embodiment 2 has a layer structure which includes: a substrate 201 which is, e.g., an n-type GaN bulk substrate of the (0001) face; and a lower cladding layer 202 (first cladding layer) which is, e.g., an n-type $Al_xGa_{1-x}N$ ($0 \leq x \leq 1$) layer, a lower guide layer 203 (first guide layer) which is, e.g., an n-type $In_{0.02}Ga_{0.98}N$ layer, an active layer 204 having a quantum well structure and is, e.g., an $In_{0.15}Ga_{0.85}N$/GaN active layer, an upper guide layer 205 (second guide layer) which is, e.g., a p-type $In_{0.02}Ga_{0.98}N$ layer, an electronic barrier layer 206 which is, e.g., a thin-film p-type $Al_xGa_{1-x}N$ ($0 \leq x \leq 1$) layer, and an upper cladding layer 207 (second cladding layer), layered sequentially above the substrate 201.

The upper cladding layer 207 includes a plurality of layers and, in the present embodiment, has a double-layered structure of a first upper cladding layer 208 and a second upper cladding layer 209.

The first upper cladding layer 208 comprises a nitride semiconductor, and is a nitride semiconductor cladding layer (nitride semiconductor layer) formed closer to the active layer 204 than the second upper cladding layer 209. The first upper cladding layer 208 may comprise, for example, p-type $Al_{x+y}In_{1-y}Ga_{1-x}N$ ($0<x \leq 0.82$, $0 \leq y \leq 0.18$, and $0 \leq 1-x-y<1$).

The second upper cladding layer 209 comprises a transparent conductive film (transparent conductor), and is a transparent conductor cladding layer (transparent conductive layer) formed farther from the active layer 204 than the first upper cladding layer 208. The second upper cladding layer 209 may comprise ITO, for example.

The nitride semiconductor light-emitting device 200 according to the present embodiment includes a ridge-shaped optical waveguide 220 which has a ridge (protruding portion) formed by deeply digging the nitride semiconductor light-emitting device 200 to a layer lower than the active layer 204. It is to be noted that the optical waveguide 220 in the present embodiment is different from the optical waveguide 120 in Embodiment 1 in that the optical waveguide 220 has a vertical mesa structure formed by deeply digging from the first upper cladding layer 208 to part of the lower cladding layer 202. Specifically, in the present embodiment, the second upper cladding layer 209 is formed to cover the ridge.

On a top face of the lower cladding layer 202 and lateral faces of the ridge of the optical waveguide 220, an insulating film 230 comprising $SiO_2$ is formed. Furthermore, the second upper cladding layer 209 is formed on the insulating film 230 and a top face of the first upper cladding layer 208, to cover the lower cladding layer 202 and the ridge of the optical waveguide 220. Furthermore, a p-side electrode 240 is formed on a contact face 225 of the protruding portion of the second upper cladding layer, to cover the second upper cladding layer 209. Furthermore, a pad electrode 241 is formed to cover the p-side electrode 240. Furthermore, an n-side electrode 250 is formed on a reverse face of the substrate 201.

Furthermore, in the present embodiment, as shown in FIG. 7A, the optical waveguide 220 curves by a curvature radius greater than or equal to 3000 μm near the light-emitting end face, and the optical waveguide 220 is tilted with respect to the light-emitting end face. In the present embodiment, the angle defined by the light-emitting end face and the optical waveguide 220 is set to be 10 degrees, for example.

As described above, in the present embodiment too, the first upper cladding layer 208 comprising the nitride semiconductor is provided immediately under the second upper cladding layer 209 comprising the transparent conductive film in the upper cladding layer 207. Therefore, a difference is caused between the refractive index of the first upper cladding layer 208 and the refractive index of the upper guide layer 205 formed below the first upper cladding layer 208 and comprising p-type InGaN. Specifically, the first upper cladding layer 208 formed closer to the active layer 204 can confine light. Thus, increase of the internal loss (αi) caused by light absorption can be suppressed even when the second upper cladding layer 209 comprises a transparent conducting oxide film having low crystallinity and therefore the extinction coefficient is high. As a result, a nitride semiconductor light-emitting device with high light-emission efficiency can be realized.

Furthermore, the second upper cladding layer 209 comprising the transparent conductive film serves also as a cladding layer which confines light and carriers, and therefore the second upper cladding layer 209 can confine light in the longitudinal direction. Thus, the film thickness of the first upper cladding layer 208 comprising p-type $Al_{x+y}In_{1-y}Ga_{1-x}N$ can be thinner, and therefore the series resistance of the first upper cladding layer 208 can be reduced. As a result, a nitride semiconductor light-emitting device with a low operating voltage can be realized.

As described above, with the nitride semiconductor light-emitting device 200 according to Embodiment 2, a nitride semiconductor light-emitting device with high light-emission efficiency and low operating voltage can be realized.

Figure 8:
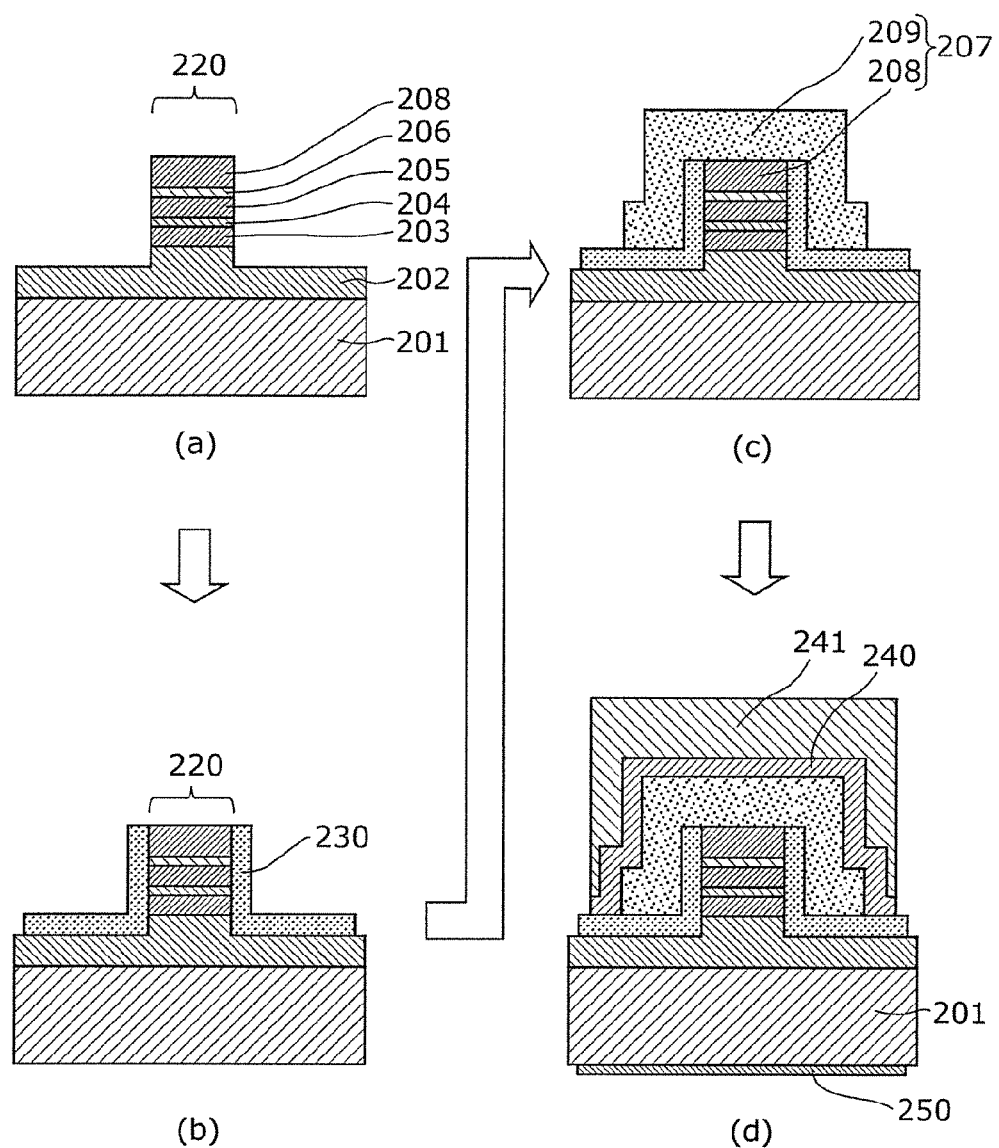
FIG. 8 is a diagram showing a method for manufacturing the nitride semiconductor light-emitting device according to Embodiment 2.

Next, a method for manufacturing the nitride semiconductor light-emitting device 200 according to Embodiment 2 is described with reference to FIG. 8. FIG. 8 is a diagram showing the method for manufacturing the nitride semiconductor light-emitting device according to Embodiment 2.

First, on the substrate 201, the lower cladding layer 202 is formed by forming, e.g., Si-doped $Al_{0.05}Ga_{0.95}N$ to have a film thickness of 1.5 μm by MOCVD. Then, the following are formed sequentially: the lower guide layer 203 which is, e.g., Si-doped $In_{0.02}Ga_{0.98}N$; the active layer 204 in which, e.g., a plurality of $In_{0.15}Ga_{0.85}N$ well layer/GaN barrier layer are formed (e.g., three layers); the upper guide layer 205 (film thickness: 100 nm) which is, e.g., Mg-doped $In_{0.02}Ga_{0.98}N$; and the electronic barrier layer 206 (film thickness: 10 nm) which is, e.g., Mg-doped p-type $Al_{0.2}Ga_{0.8}N$.

After that, as one of the layers constituting the upper cladding layer 207, the first upper cladding layer 208 which is the nitride semiconductor layer is formed first by forming, e.g., Mg-doped p-type $Al_{0.05}Ga_{0.95}N$ to have a film thickness of 150 nm on the electronic barrier layer 206.

Next, a $SiO_2$ film having a thickness of 800 nm is formed on the first upper cladding layer 208 by plasma CVD. After that, the $SiO_2$ film is selectively removed by photolithography and etching using hydrofluoric acid, and then a $SiO_2$ mask is formed which has a width of, for example, 1.5 μm and is to be the ridge-shaped optical waveguide 220. After that, dry etching is performed using $Cl_2$ gas, and the area not covered with the $SiO_2$ mask is etched to (part or all of) the lower cladding layer 202. Thus, as shown in (a) in FIG. 8, the protruding (ridge) pattern having the width of 1.5 μm is formed.

Next, the insulating film 230 is formed by forming the $SiO_2$ film having a thickness of 300 nm to cover the entire face above the substrate 201, by plasma CVD. After that, by removing the $SiO_2$ mask, the ridge-shaped optical waveguide 220 is formed as shown in (b) in FIG. 8.

After that, the second upper cladding layer 209 in a predetermined shape can be formed by forming, e.g., ITO to have a film thickness of 200 nm and patterning by a sputtering apparatus or an electron beam vapor deposition apparatus. Thus, as shown in (c) in FIG. 8, the double-layered upper cladding layer 207 can be formed.

Next, as shown in (d) in FIG. 8, the p-side electrode 240 comprising palladium (Pd) having a thickness of 45 nm and platinum (Pt) having a thickness of 50 nm is formed to cover the optical waveguide 220, by the photolithography and EB vapor deposition. Then, the pad electrode 241 is formed by forming a film by layering titanium (Ti) having a thickness of 50 nm and gold (Au) having a thickness of 1000 nm by the photolithography and EB vapor deposition, and then increasing the thickness of Au to 10 μm by electroplating.

After that, the thickness of the substrate 201 is reduced to approximately 100 μm by polishing using diamond slurry, and then, on the reverse face of the substrate 201, the following are formed by the EB vapor deposition apparatus as the n-type electrode 250: Ti having a thickness of 5 nm, Pt having a thickness of 10 nm, and Au having a thickness of 1000 nm. After that, the above is cleaved in bars and divided into chips. This is how the nitride semiconductor light-emitting device 200 according to the present embodiment is manufactured.

Here, with reference to FIG. 9, description is provided on the reason why the upper cladding layer 207 has the double-layered structure including: the first upper cladding layer 208 comprising the nitride semiconductor and formed closer to the active layer 204; and the second upper cladding layer 209 comprising the transparent conductor and formed on the first upper cladding layer 208.

FIG. 9 is a comparison table which shows parameters for calculation and characteristics of six kinds of nitride semiconductor light-emitting devices ("structure G" to "structure L") each having a different structure. It is to be noted that conditions for the nitride semiconductor light-emitting device of each structure in FIG. 9 are set by corresponding each layer of the structure with each layer of the nitride semiconductor light-emitting device shown in FIG. 7B.

In FIG. 9, the "structure G" is a structure in which only $Al_{0.05}Ga_{0.95}N$ is used as the upper cladding layer 207 and the transparent conductive layer is not provided. The "structure G" is the standard structure. The "structure H" is a structure in which the first upper cladding layer (nitride semiconductor layer) 208 is not provided and only the second upper cladding layer 209 comprising ITO is provided. The "structure I" is a structure in which GaN is used as the material for the first upper cladding layer 208 and ITO is used as the material for the second upper cladding layer 209. The "structure J" is a structure in which $Al_{0.05}Ga_{0.95}N$ is used as the material for the first upper cladding layer 208 and ITO is used as the material for the second upper cladding layer 209. The "structure K" does not include the transparent conductive layer, in the same manner as the "structure G". However, the "structure K" is a structure in which the film thickness of the upper cladding layer 207 is thin, $Al_{0.05}Ga_{0.95}N$ having a film thickness of 150 nm is used as the material for the first upper cladding layer 208, and the second upper cladding layer 209 is not provided. The "structure L" is a structure in which $Al_{0.2}In_{0.1}Ga_{0.7}N$ is used as the material for the first upper cladding layer 208 and ITO is used as the material for the second upper cladding layer 209.

It is to be noted that, out of the six kinds of structures shown in FIG. 9, the nitride semiconductor light-emitting device 200 according to Embodiment 2 is the structure J and the structure L. The structure J does not include indium (In) in the first upper cladding layer 208.

FIG. 9 shows, for each of the six kinds of nitride semiconductor light-emitting devices, values of the light confinement coefficient (Γ) and the waveguide loss (αi), which determine the current-light-output characteristics.

As shown in the result in FIG. 9, with the nitride semiconductor light-emitting device of the structure J and the structure L which are the structures according to the present embodiment, a higher light confinement coefficient can be obtained than the nitride semiconductor light-emitting device of the structure G, which is the standard laser structure, while suppressing the waveguide loss at the same level as the structure G. As a result, with the nitride semiconductor light-emitting device 200 according to the present embodiment, the current-voltage characteristics can be improved while obtaining the current-light output characteristics at the same level as those of the nitride semiconductor light-emitting device of the standard structure G.

Figure 10A:
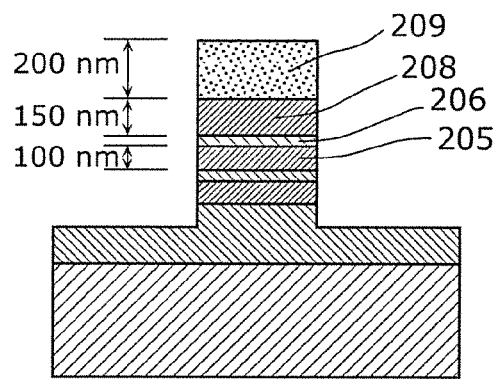
FIG. 10A shows a structure of the nitride semiconductor light-emitting device used for illustrating a design example of the second upper cladding layer.
Figure 10B:
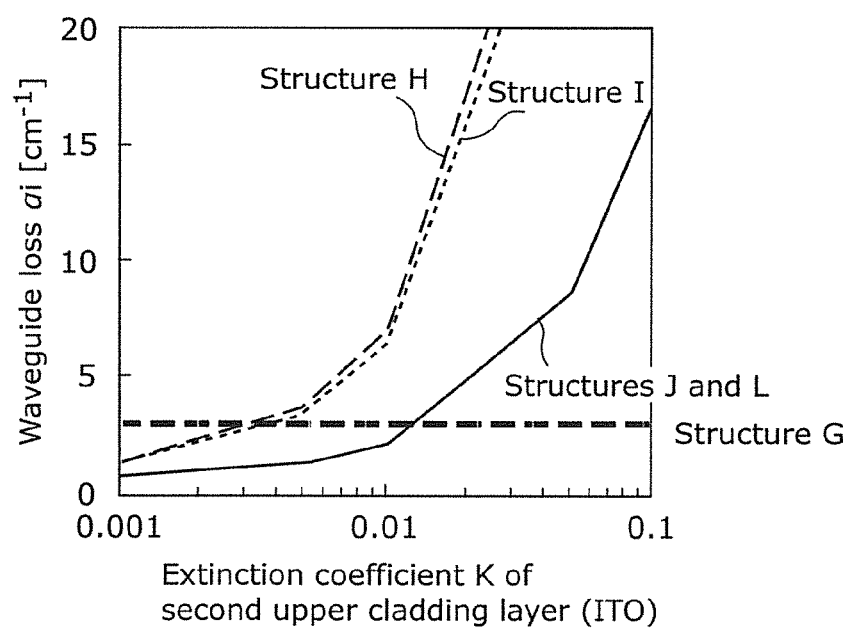
FIG. 10B shows a relationship between an extinction coefficient (K) of ITO and waveguide loss (αi) when the structure shown in FIG. 10A is adopted.

Next, regarding the above "structure G" to "structure L" (except "structure K"), description is provided on a relationship between characteristics of the ITO which is the material for the upper cladding layer 209 and characteristics of the nitride semiconductor light-emitting device, with reference to FIG. 10A and FIG. 10B. FIG. 10A shows a structure of the nitride semiconductor light-emitting device used for illustrating a design example of the second upper cladding layer 209. FIG. 10B shows a relationship between an extinction coefficient (K) of ITO and waveguide loss (αi) when the structure shown in FIG. 10A is adopted. FIG. 10B shows dependency of the extinction coefficient (K) of ITO on the waveguide loss.

As shown in FIG. 10B, to suppress the waveguide loss of the nitride semiconductor light-emitting device of the "structure H" or "structure I" to the same level as that of the nitride semiconductor light-emitting device of the "structure G", "structure J", and "structure L", it is sufficient to reduce the extinction coefficient (K) of the second upper cladding layer 209 (ITO) to approximately $10^{-3}$ which requires an increase in the crystallinity of the ITO. However, under present circumstances, it is almost impossible to form the ITO having such a high crystallinity level.

In contrast, with the nitride semiconductor light-emitting device of the "structure J" and "structure L", the waveguide loss (αi) can be suppressed at the same level as that of the "structure G", even when the extinction coefficient (K) of the second upper cladding layer 209 (ITO) is $10^{-2}$ which is relatively great. Specifically, even when the second upper cladding layer 209 is the ITO having a low crystallinity, the waveguide loss (αi) at the same level as that of the nitride semiconductor light-emitting device of the "structure G" can be obtained. This is because, in the nitride semiconductor light-emitting device of the "structure J" and "structure L", the first upper cladding layer 208 comprising AlGaN which has a low refractive index contributes to light confinement and therefore almost no light exudes to the second upper cladding layer 209.

As described above, with the nitride semiconductor light-emitting device 200 according to the present embodiment, it is possible to suppress the increase of the waveguide loss (αi) caused by light absorption, even when the second upper cladding layer 209 is the ITO having low crystallinity. Furthermore, the second upper cladding layer 209 comprising ITO has a low refractive index than that of the first upper cladding layer 208 which comprises p-type AlGaN. Therefore, the second upper cladding layer 209 serves also as the light confinement layer. This makes it possible to make the film thickness of the first upper cladding layer 208 thinner. Accordingly, a nitride semiconductor light-emitting device with high light-emission efficiency and low operating voltage can be realized.

Figure 11A:
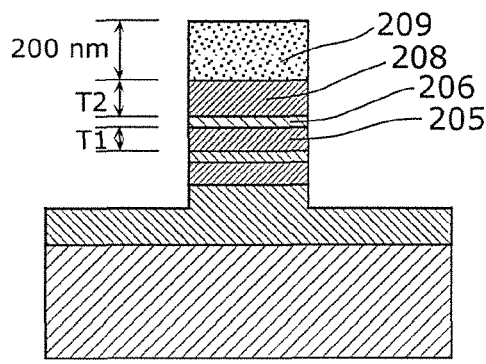
FIG. 11A shows a structure of the nitride semiconductor light-emitting device used for illustrating a design example of the upper guide layer and the first upper cladding layer.
Figure 11B:
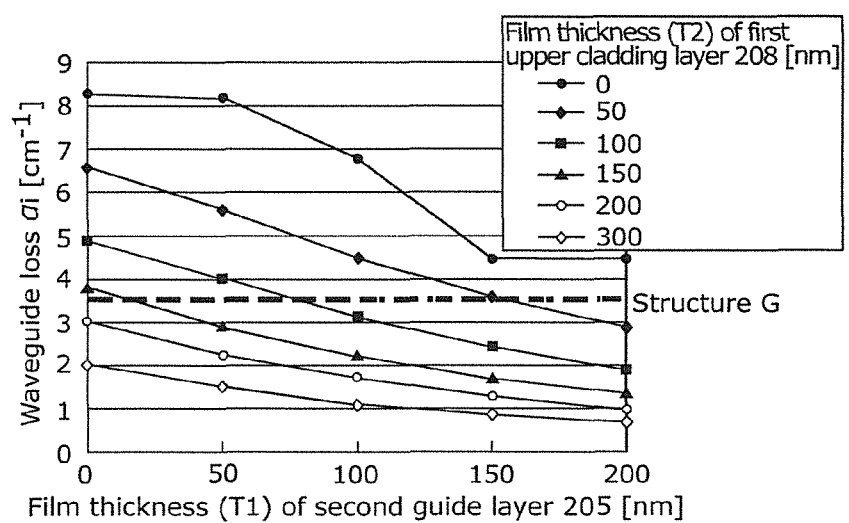
FIG. 11B shows a relationship between: the film thicknesses of the second guide layer and the first upper cladding layer; and waveguide loss, in the nitride semiconductor light-emitting device shown in FIG. 11A.
Figure 11C:
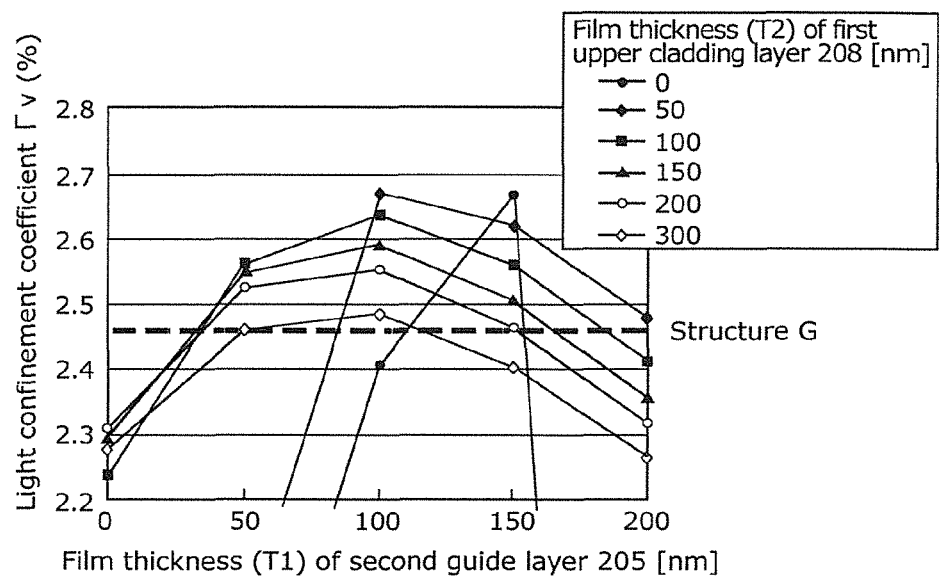
FIG. 11C shows a relationship between: the film thicknesses of the second guide layer and the first upper cladding layer; and a light confinement coefficient, in the nitride semiconductor light-emitting device shown in FIG. 11A.

Next, description is provided on an example of the film thickness of the upper guide layer 205 of the nitride semiconductor light-emitting device 200 according to the present embodiment, with reference to FIG. 11A, FIG. 11B, and FIG. 11C.

FIG. 11A shows a structure of the nitride semiconductor light-emitting device used for illustrating a design example of the upper guide layer 205 and the first upper cladding layer 208. FIG. 11B shows a relationship between: the film thicknesses of the second guide layer and the first upper cladding layer; and the waveguide loss, in the nitride semiconductor light-emitting device shown in FIG. 11A. FIG. 11C shows a relationship between: the film thicknesses of the second guide layer and the first upper cladding layer; and the light confinement coefficient, in the nitride semiconductor light-emitting device shown in FIG. 11A.

In the above structure, the film thickness of the p-type InGaN which is the upper guide layer 205 is set to 100 nm, the film thickness of the p-type AlGaN which is the first upper cladding layer 208 is set to 150 nm, and the film thickness of the second upper cladding layer 209 is set to 200 nm.

Here, the light confinement coefficient (Γ) and waveguide loss (αi) are determined based on the film thickness (T1) of the p-type InGaN which is the upper guide layer 205, and the film thickness (T2) of the p-type AlGaN which is the first upper cladding layer 208.

Therefore, there are cases where the advantageous effects of the above nitride semiconductor light-emitting device according to the present embodiment cannot be produced sufficiently, depending on the film thicknesses of the p-type InGaN which is the upper guide layer 205 and the p-type AlGaN which is the first upper cladding layer 208.

Therefore, as shown in the structure shown in FIG. 11A, the film thickness of the upper guide layer 205 comprising p-type InGaN is set to T1 and the film thickness of the first upper cladding layer 208 comprising p-type AlGaN is set to T2, and the light confinement coefficient (Γ) and waveguide loss (αi) with respect to the change in the film thickness is calculated. The calculation result is shown in FIG. 11B and FIG. 11C.

As shown in FIG. 11B and FIG. 11C, to obtain the nitride semiconductor light-emitting device realizing the higher light confinement and the lower waveguide loss than those of the standard structure G (light confinement coefficient: 2.46% and waveguide loss: 3.5 cm$^{-1}$), the film thickness (T1) of the second guide layer may be 200 nm when the film thickness (T2) of the second upper cladding layer 209 is 50 nm, for example. Furthermore, when the film thickness (T2) of the second upper cladding layer 209 is 100 nm, the film thickness (T1) of the second guide layer may be greater than or equal to 50 nm and smaller than or equal to 200 nm, for example. Furthermore, when the film thickness (T2) of the second upper cladding layer 209 is 150 nm, the film thickness (T1) of the second guide layer may be greater than or equal to 50 nm and smaller than or equal to 150 nm, for example. Furthermore, when the film thickness (T2) of the second upper cladding layer 209 is 200 nm, the film thickness (T1) of the second guide layer may be greater than or equal to 50 nm and smaller than or equal to 150 nm, for example. Furthermore, when the film thickness (T2) of the second upper cladding layer 209 is 300 nm, the film thickness (T1) of the second guide layer may be greater than or equal to 50 nm and smaller than or equal to 100 nm, for example.

Using a combination of the film thickness (T1) of the upper guide layer 205 and the film thickness (T2) of the first upper cladding layer 208 within the range shown in FIG. 11B and FIG. 11C allows suppressing the increase of the waveguide loss (αi) and obtaining the desired light confinement coefficient even when the extinction coefficient of the ITO is great.

It is to be noted that when the film thickness (T1) of the upper guide layer 205 and the film thickness (T2) of the first upper cladding layer 208 is out of the above range, the waveguide loss (αi) becomes greater than that of the standard structure G and the light confinement coefficient decreases, thereby causing a deterioration in current-light output characteristics.

The foregoing is the description on the present embodiment focusing on the case where the p-type AlGaN is used as the first upper cladding layer 208. In this case, the advantageous effects of the present embodiment can be produced when the first upper cladding layer 208 is the nitride semiconductor comprising at least Al. An example of the Al composition of the first upper cladding layer 208 is 0<x≤0.1.

When the Al composition x is greater than 0.1, the series resistance of the first upper cladding layer 208 increases which deteriorates the threshold current characteristics, and a difference between the lattice constant of AlGaN and that of GaN increases which causes cracks and affects the yield.

Furthermore, as the material for the first upper cladding layer 208, not only AlGaN but also AlInN which has the same or lower refractive index than when the Al composition x of AlGaN is $0 < x \leq 0.1$ or AlInGaN which is four-element mixed crystal may be used to produce the same advantageous effects.

Furthermore, although the film thickness of the second upper cladding layer 209 of the present embodiment (structure J) is set to 200 nm, the film thickness may be thicker than at least 100 nm, for example. Making the second upper cladding layer 209 thicker allows reducing the light absorption by the electrode formed on the second upper cladding layer 209.

Embodiment 3

Next, a nitride semiconductor light-emitting device 300 according to Embodiment 3 is described with reference to the Drawings.

The nitride semiconductor light-emitting device 300 according to the present embodiment has the same basic configuration as the nitride semiconductor light-emitting devices 100 and 200 according to Embodiment 1 and Embodiment 2. Accordingly, in the present embodiment, description is provided focusing on the difference from Embodiment 1 and Embodiment 2.

For the nitride semiconductor light-emitting device according to Embodiment 3, description is provided by taking a laser diode comprising nitride semiconductor as an example.

Figure 12A:
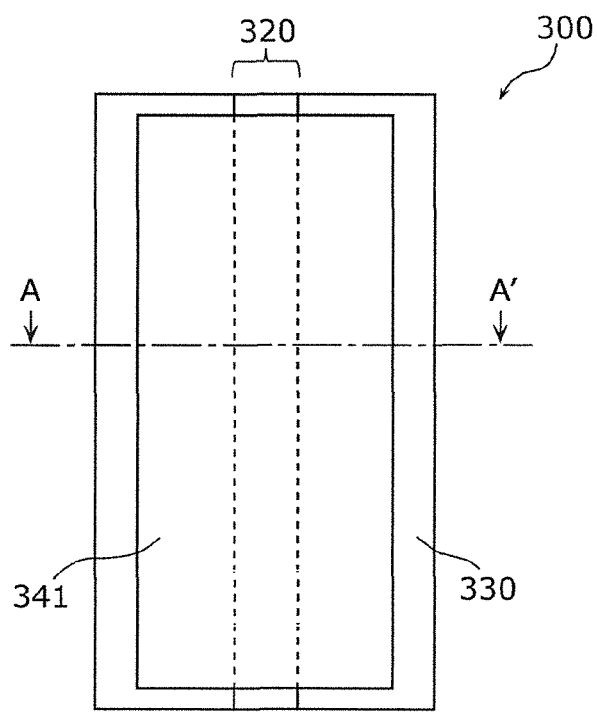
FIG. 12A is a top view of a nitride semiconductor light-emitting device according to Embodiment 3.
Figure 12B:
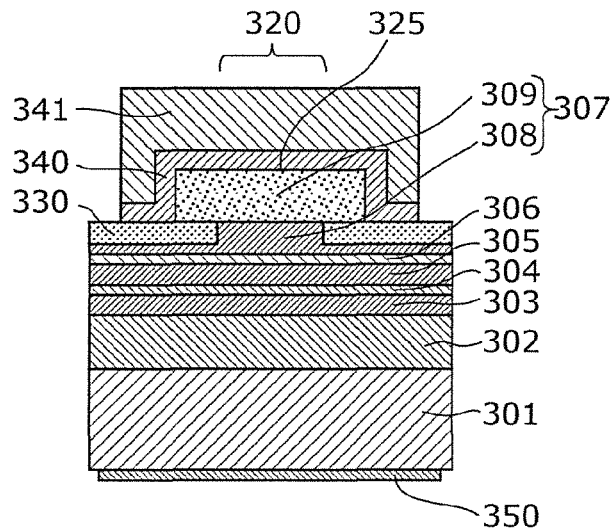
FIG. 12B is a sectional view, at an A-A' line in FIG. 12A, of the nitride semiconductor light-emitting device according to Embodiment 3.

FIG. 12A is a top view of the nitride semiconductor light-emitting device according to Embodiment 3. FIG. 12B is a sectional view, at the A-A' line in FIG. 12A, of the nitride semiconductor light-emitting device.

As shown in FIG. 12A and FIG. 12B, the nitride semiconductor light-emitting device 300 according to Embodiment 3 has a layer structure which includes: a substrate 301 which is, e.g., an n-type GaN bulk substrate of the (0001) face; and a lower cladding layer 302 (first cladding layer) which is, e.g., an n-type $Al_xGa_{1-x}N$ ($0 \leq x \leq 1$) layer, a lower guide layer 303 (first guide layer) which is, e.g., an n-type $In_{0.02}Ga_{0.98}N$ layer, an active layer 304 having a quantum well structure and is, e.g., an $In_{0.15}Ga_{0.85}N$/GaN active layer, an upper guide layer 305 (second guide layer) which is, e.g., a p-type $In_{0.02}Ga_{0.98}N$ layer, an electronic barrier layer 306 which is, e.g., a thin-film p-type $Al_xGa_{1-x}N$ ($0 \leq x \leq 1$) layer, and an upper cladding layer 307 (second cladding layer), layered sequentially above the substrate 301.

The upper cladding layer 307 includes a plurality of layers and, in the present embodiment, has a double-layered structure of a first upper cladding layer 308 and a second upper cladding layer 309.

The first upper cladding layer 308 comprises a nitride semiconductor, and is a nitride semiconductor cladding layer (nitride semiconductor layer) formed closer to the active layer 304 than the second upper cladding layer 309. The first upper cladding layer 308 may comprise, for example, p-type $Al_{x+y}In_{1-y}Ga_{1-x}N$.

The second upper cladding layer 309 comprises a transparent conductive film (transparent conductor), and is a transparent conductor cladding layer (transparent conductive layer) formed farther from the active layer 304 than the first upper cladding layer 308. The second upper cladding layer 309 may comprise ITO, for example.

The nitride semiconductor light-emitting device 300 according to the present embodiment includes a ridge-shaped optical waveguide 320 which has a ridge and has a part or all of the first upper cladding layer 308 in a vertical mesa structure. The surface of the first upper cladding layer 308 expect the topmost portion of the optical waveguide 320, specifically, the lateral faces of the ridge and the surface of the planar portion of the first upper cladding layer 308, is covered with the insulating film 330 comprising $SiO_2$, for example.

Furthermore, the second upper cladding layer 309 is formed to contact the surface of the first upper cladding layer 308 which is the topmost portion of the optical waveguide 320. Furthermore, the second upper cladding layer 309 is formed to spread in the lateral direction broader than the top face of the protruding portion (ridge) of the optical waveguide 320, and to cover the protruding portion of the optical waveguide 320 and part of the surface of the insulating film 330.

Furthermore, a p-side electrode 340 is formed on the second upper cladding layer 309 via a contact face 325. Furthermore, a pad electrode 341 is formed to cover the p-side electrode. Furthermore, an n-side electrode 350 is formed on a reverse face of the substrate 301.

As described above, in the present embodiment too, the first upper cladding layer 308 comprising the nitride semiconductor is provided immediately under the second upper cladding layer 309 comprising the transparent conductive film in the upper cladding layer 307. Therefore, a difference is caused between the refractive index of the first upper cladding layer 308 and the refractive index of the upper guide layer 305 formed below the first upper cladding layer 308 and comprising p-type InGaN. Specifically, the first upper cladding layer 308 formed closer to the active layer 304 can confine light. Thus, increase of the internal loss ($\alpha i$) caused by light absorption can be suppressed even when the second upper cladding layer 309 comprises a transparent conducting oxide film having low crystallinity and therefore the extinction coefficient is high. As a result, a nitride semiconductor light-emitting device with high light-emission efficiency can be realized.

Furthermore, the second upper cladding layer 309 comprising the transparent conductive film serves also as a cladding layer which confines light and carriers, and therefore the second upper cladding layer 309 can confine light in the longitudinal direction. Thus, the film thickness of the first upper cladding layer 308 comprising p-type $Al_{x+y}In_{1-y}Ga_{1-x}N$ can be thinner, and therefore the series resistance of the first upper cladding layer 308 can be reduced. In addition, in the present embodiment, the second upper cladding layer 309 is formed larger in the lateral direction than the protruding portion of the optical waveguide 320, and therefore the contact face 325 between the p-side electrode 340 can be set to be larger. Thus, the contact resistance at the contact face 325 can be reduced. As a result, a nitride semiconductor light-emitting device which can work with a lower operating voltage can be realized.

As described above, with the nitride semiconductor light-emitting device 300 according to Embodiment 3, a nitride semiconductor light-emitting device with high light-emission efficiency and lower operating voltage can be realized.

Figure 13A:
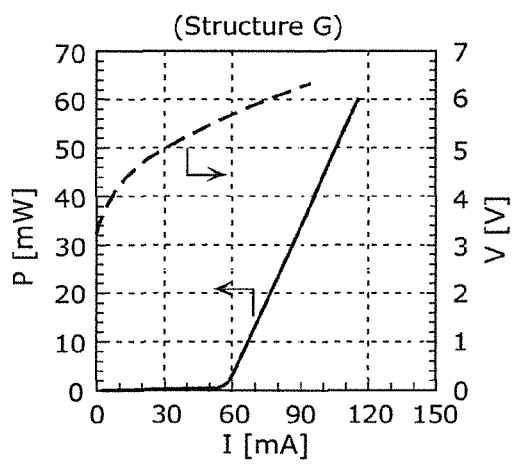
FIG. 13A shows current-light output characteristics and current-voltage characteristics of the nitride semiconductor light-emitting device (Structure G) manufactured using the parameters shown in FIG. 9, in the nitride semiconductor light-emitting device according to Embodiment 3.
Figure 13B:
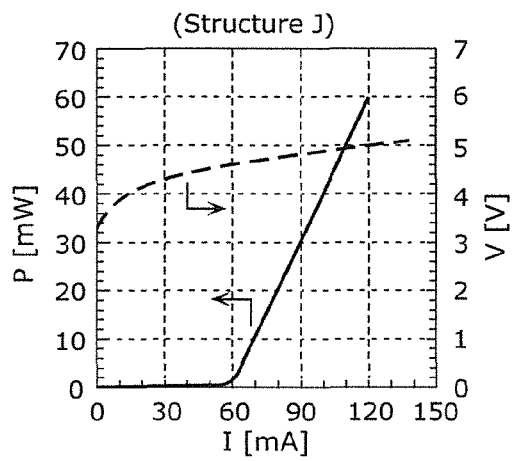
FIG. 13B shows current-light output characteristics and current-voltage characteristics of the nitride semiconductor light-emitting device (Structure J) manufactured using the parameters shown in FIG. 9, in the nitride semiconductor light-emitting device according to Embodiment 3.
Figure 13C:
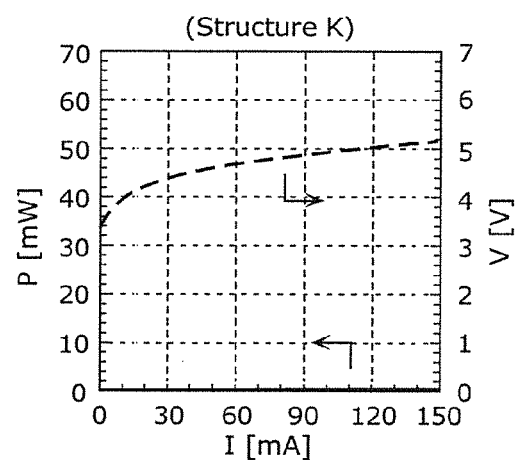
FIG. 13C shows current-light output characteristics and current-voltage characteristics of the nitride semiconductor light-emitting device (Structure K) manufactured using the parameters shown in FIG. 9, in the nitride semiconductor light-emitting device according to Embodiment 3.

Next, the function effect of the nitride semiconductor light-emitting device 300 according to Embodiment 3 is described with reference to FIG. 13A to FIG. 13C. FIGS. 13A to 13C each shows a current-light output characteristics and current-voltage characteristics of the nitride semiconductor light-emitting device manufactured using the parameters shown in FIG. 9 (Structure G, Structure J, and Structure K), in the nitride semiconductor light-emitting device according to Embodiment 3.

Specifically, FIG. 13A shows characteristics of the nitride semiconductor light-emitting device produced experimentally using the parameters of the standard structure G in which only $Al_{0.05}Ga_{0.95}N$ is used and the second upper cladding layer (ITO) is not provided. FIG. 13B shows characteristics of the nitride semiconductor light-emitting device produced experimentally using the parameters of the structure J in which the first upper cladding layer (nitride semiconductor) and the second upper cladding layer (ITO) are used as the upper cladding layer. FIG. 13C shows characteristics of the nitride semiconductor light-emitting device produced experimentally using the parameters of the structure K in which $Al_{0.05}Ga_{0.95}N$ having a film thickness of 150 nm is used as the first upper cladding layer and the second upper cladding layer (ITO) is not provided.

By comparing the FIGS. 13A to 13C, it can be understood that with the nitride semiconductor light-emitting device which corresponds to the structure of the present embodiment and is shown in FIG. 13B, the operating voltage is reduced significantly though the current-light output characteristics are approximately at the same level, as compared with the standard nitride semiconductor light-emitting device shown in FIG. 13A.

In contrast, it can be understood that with the nitride semiconductor light-emitting device not corresponding to the structure of the present embodiment, which has the cladding layer structure of only $Al_{0.05}Ga_{0.95}N$ having the film thickness of 150 nm and is shown in FIG. 13C, though the operating voltage is reduced the light absorption by the p-side electrode is increased and the desired light output cannot be obtained, as compared with the standard nitride semiconductor light-emitting device shown in FIG. 13A.

The above result shows that, with the nitride semiconductor light-emitting device 300 having the structure according to the present embodiment, the operating voltage can be reduced without deteriorating the current-light output characteristics.

Embodiment 4

Figure 14:
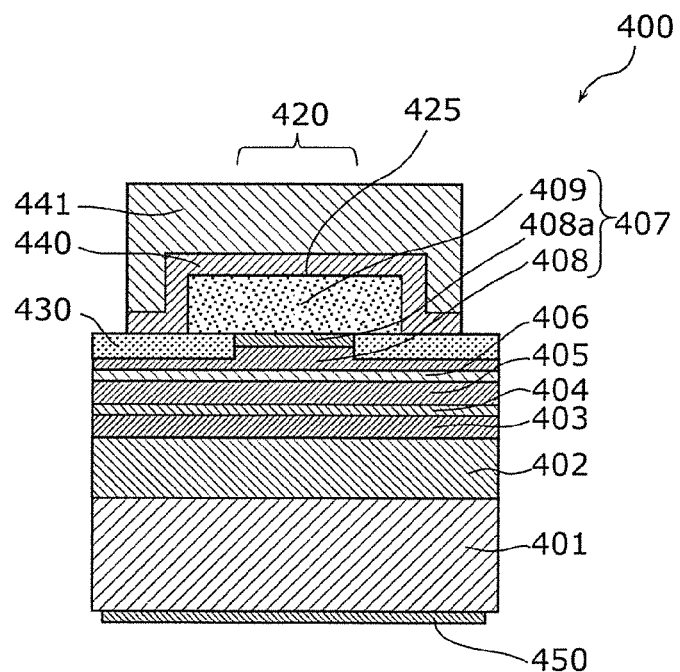
FIG. 14 is a cross-sectional view of a nitride semiconductor light-emitting device according to Embodiment 4.

Next, a nitride semiconductor light-emitting device 400 according to Embodiment 4 is described with reference to FIG. 14. FIG. 14 is the cross-sectional view of the nitride semiconductor light-emitting device according to Embodiment 4.

The nitride semiconductor light-emitting device 400 according to the present embodiment has the same basic configuration as the nitride semiconductor light-emitting device 300 according to Embodiment 3. Accordingly, in the present embodiment, description is provided focusing on the difference from Embodiment 3.

As shown in FIG. 14, the nitride semiconductor light-emitting device 400 according to Embodiment 4 has a layer structure which includes: a substrate 401 which is, e.g., an n-type GaN bulk substrate of the (0001) face; and a lower cladding layer 402 (first cladding layer) which is, e.g., an n-type $Al_xGa_{1-x}N$ (0≤x≤1) layer, a lower guide layer 403 (first guide layer) which is, e.g., an n-type GaN layer, an active layer 404 having a quantum well structure and is, e.g., an InGaN active layer, an upper guide layer 405 (second guide layer) which is, e.g., a p-type GaN layer, an electronic barrier layer 406 which is, e.g., a thin-film p-type $Al_xGa_{1-x}N$ (0≤x≤1) layer, and an upper cladding layer 407 (second cladding layer), layered sequentially above the substrate 401.

The upper cladding layer 407 includes a plurality of layers and, in the present embodiment, has a three-layer structure of a first upper cladding layer 408, a second upper cladding layer 409, and a third upper cladding layer 408a formed between the first upper cladding layer 408 and the second upper cladding layer 409.

The first upper cladding layer 408 comprises a nitride semiconductor, and is a nitride semiconductor cladding layer (nitride semiconductor layer) formed closer to the active layer 404 than the second upper cladding layer 409 and the third upper cladding layer 408a. The first upper cladding layer 408 may comprise, for example, p-type $Al_{x+y}In_{1-y}Ga_{1-x}N$.

The second upper cladding layer 409 comprises a transparent conductive film (transparent conductor), and is a transparent conductor cladding layer (transparent conductive layer) formed farther from the active layer 404 than the first upper cladding layer 408 and the third upper cladding layer 408a. The second upper cladding layer 409 may comprise ITO, for example.

The third upper cladding layer 408a comprises a nitride semiconductor, and is an n-type contact layer formed on the first upper cladding layer 408. The third upper cladding layer 408a is formed as a tunnel electrode, and may comprise an n-type InGaN/GaN super-lattice layer highly doped with Si, for example.

The nitride semiconductor light-emitting device 400 according to the present embodiment includes a ridge-shaped optical waveguide 420 which has a ridge having the third upper cladding layer 408a and a part of the first upper cladding layer 408 in a vertical mesa structure. The area of the optical waveguide 420 expect the ridge, specifically, (i) the lateral faces of the ridge and the surface of the planar portion of the first upper cladding layer 408 and (ii) the lateral faces of the third upper cladding layer 408a, is covered with the insulating film 430 comprising $SiO_2$, for example.

Furthermore, the second upper cladding layer 409 is formed to contact the surface of the third upper cladding layer 408a which is the topmost portion of the optical waveguide 420. Furthermore, the second upper cladding layer 409 is formed to spread in the lateral direction broader than the top face of the protruding portion (ridge) of the optical waveguide 420, and to cover the protruding portion of the optical waveguide 420 and part of the surface of the insulating film 430.

Furthermore, a p-side electrode 440 is formed on the contact face 425 of the second upper cladding layer 409, and a pad electrode 441 is formed on the p-side electrode 440. Furthermore, an n-side electrode 450 is formed on a reverse face of the substrate 401.

As described above, in the present embodiment too, the first upper cladding layer 408 comprising the nitride semiconductor is provided below the second upper cladding layer 409 comprising the transparent conductive film in the same manner as in Embodiment 3. Therefore, the increase of the internal loss (αi) caused by light absorption can be suppressed and the series resistance of the first upper cladding layer 408 can be reduced. In addition, the second upper cladding layer 409 is formed larger in the lateral direction than the protruding portion of the optical waveguide 420 which allows the contact face 425 between the p-side electrode 440 to be set to be larger, and therefore the contact resistance at the contact face 425 can be reduced.

Moreover, in the present embodiment, the third upper cladding layer 408a is formed between the first upper cladding layer 408 and the second upper cladding layer 409. Thus, carriers can be moved by the tunnel current between the first upper cladding layer 408 and the second upper cladding layer 409. As a result, the contact resistance between the second upper cladding layer 409 and the first upper cladding layer 408 can be further reduced.

As described above, with the nitride semiconductor light-emitting device 400 according to Embodiment 4, it is possible to further reduce the operating voltage of the nitride semiconductor light-emitting device. Therefore, a nitride semiconductor light-emitting device is provided which can realize both the high light-emission efficiency and the low operating voltage.

It is to be noted that, although the InGaN/GaN super-lattice layer highly doped with Si is used as the third upper cladding layer 408a in the present embodiment, this is not the only example. As the third upper cladding layer 408a, for example, GaN highly doped with Si or a single n-type contact layer comprising InGaN may be used.

Embodiment 5

Next, a nitride semiconductor light-emitting device 500 according to Embodiment 5 is described with reference to FIG. 15.

Figure 15:
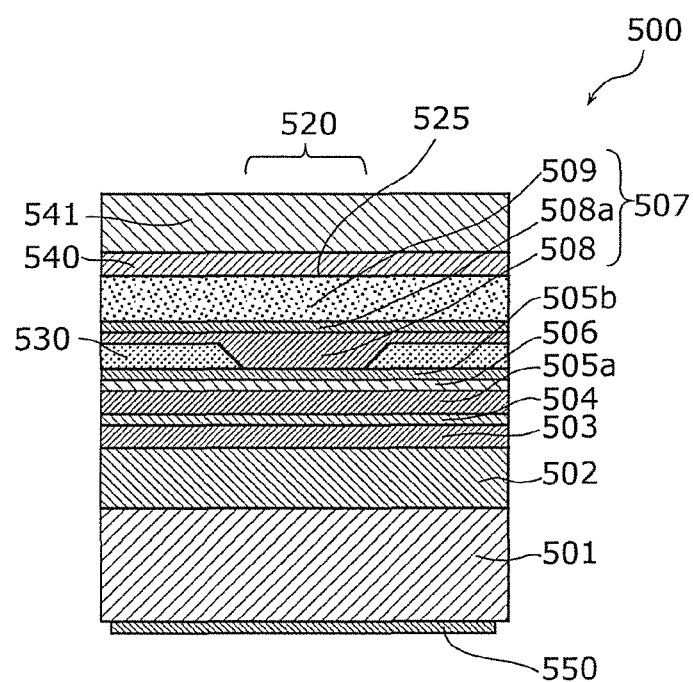
FIG. 15 is a cross-sectional view of a nitride semiconductor light-emitting device according to Embodiment 5.

As shown in FIG. 15, the nitride semiconductor light-emitting device 500 according to the present embodiment is a buried (RISA type) semiconductor laser comprising a nitride semiconductor, and has a layer structure which includes: a substrate 501 which is, e.g., an n-type GaN bulk substrate of the (0001) face; and a lower cladding layer 502 (first cladding layer) which is, e.g., an n-type $Al_xGa_{1-x}N$ ($0 \leq x \leq 1$) layer, a lower guide layer 503 (first guide layer) which is, e.g., an n-type InGaN layer, an active layer 504 having a quantum well structure and is, e.g., an InGaN active layer, a first upper guide layer 505a (second guide layer 1) which is, e.g., a p-type InGaN layer, an electronic barrier layer 506 which is, e.g., a thin-film p-type $Al_xGa_{1-x}N$ ($0 \leq x \leq 1$) layer, a second upper guide layer 505b (second guide layer 2) which is, e.g., a p-type GaN layer, a current blocking layer 530 which has an opening on the second upper guide layer 505b and is, e.g., an n-type AlGaN layer, and an upper cladding layer 507 (second cladding layer) formed on the current blocking layer 530 to bury the opening, layered sequentially above the substrate 501. It is to be noted that the current blocking layer 530 comprises high Al-composition AlGaN having a high Al-composition ratio.

The upper cladding layer 507 includes a plurality of layers and, in the present embodiment, has a three-layer structure of a first upper cladding layer 508, a second upper cladding layer 509, and a third upper cladding layer 508a formed between the first upper cladding layer 508 and the second upper cladding layer 509.

The first upper cladding layer 508 comprises a nitride semiconductor, and is a nitride semiconductor cladding layer (nitride semiconductor layer) formed closer to the active layer 504 than the second upper cladding layer 509 and the third upper cladding layer 508a. The first upper cladding layer 508 is formed on the first upper guide layer 505a and the current blocking layer 530 to bury the opening of the current blocking layer 530, and may comprise p-type $Al_{x+y}In_{1-y}Ga_{1-x}N$, for example.

The second upper cladding layer 509 comprises a transparent conductive film (transparent conductor), and is a transparent conductor cladding layer (transparent conductive layer) formed farther from the active layer 504 than the first upper cladding layer 508 and the third upper cladding layer 508a. The second upper cladding layer 509 may comprise ITO, for example.

The third upper cladding layer 508a comprises the nitride semiconductor, and is an n-type contact layer formed on the first upper cladding layer 508. The third upper cladding layer 508a is formed as a tunnel electrode, and may comprise an n-type InGaN/GaN super-lattice layer highly doped with Si, for example.

The nitride semiconductor light-emitting device 500 according to the present embodiment includes a buried optical waveguide 520 formed by burying the first upper cladding layer 508 into the opening of the current blocking layer 530.

Furthermore, a p-side electrode 540 is formed on the contact face 525 of the second upper cladding layer 509, and a pad electrode 541 is formed on the p-side electrode 540. Furthermore, an n-side electrode 550 is formed on a reverse face of the substrate 501.

Figure 16:
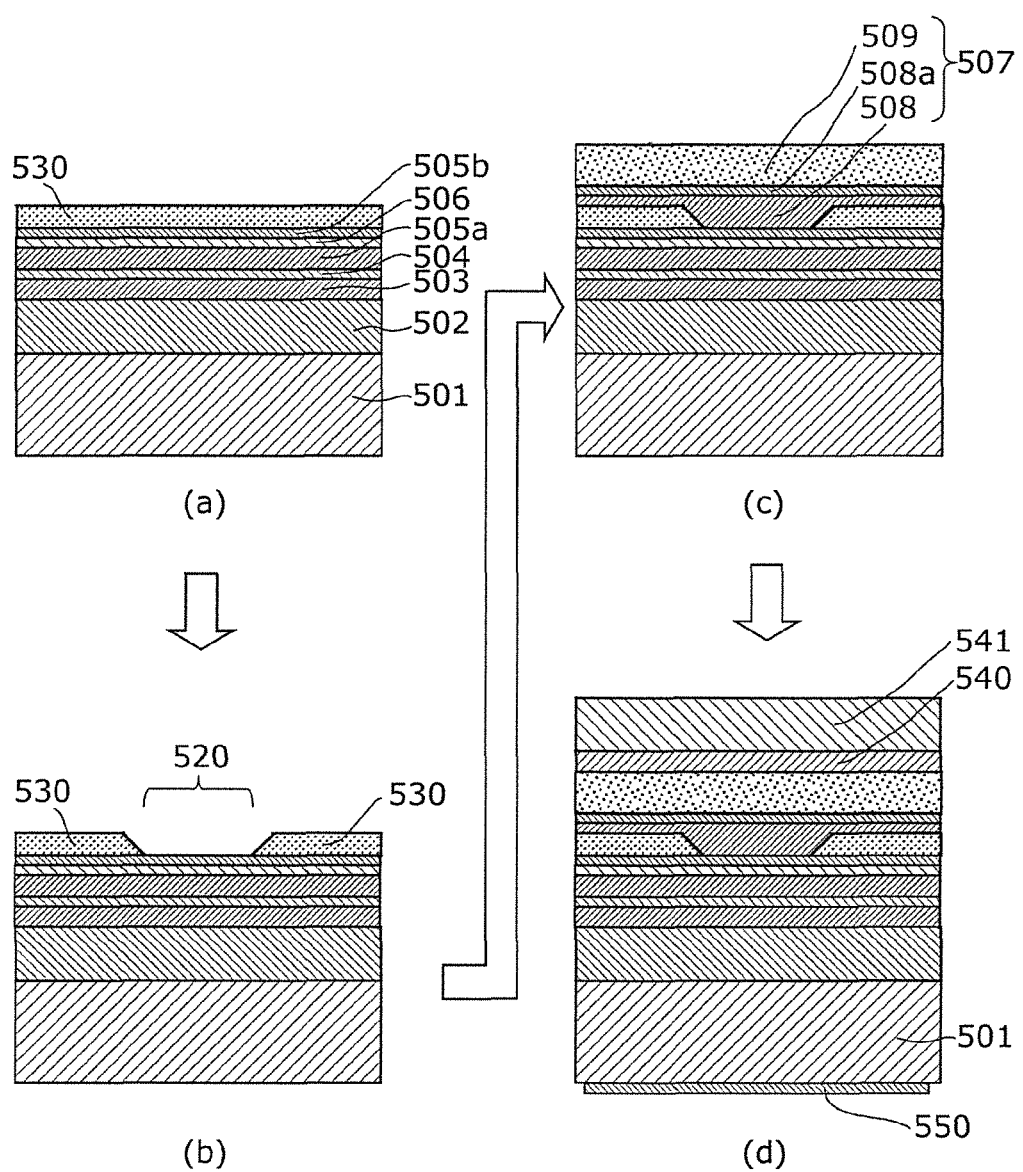
FIG. 16 is a diagram showing a method for manufacturing the nitride semiconductor light-emitting device according to Embodiment 5.
Figure 17:
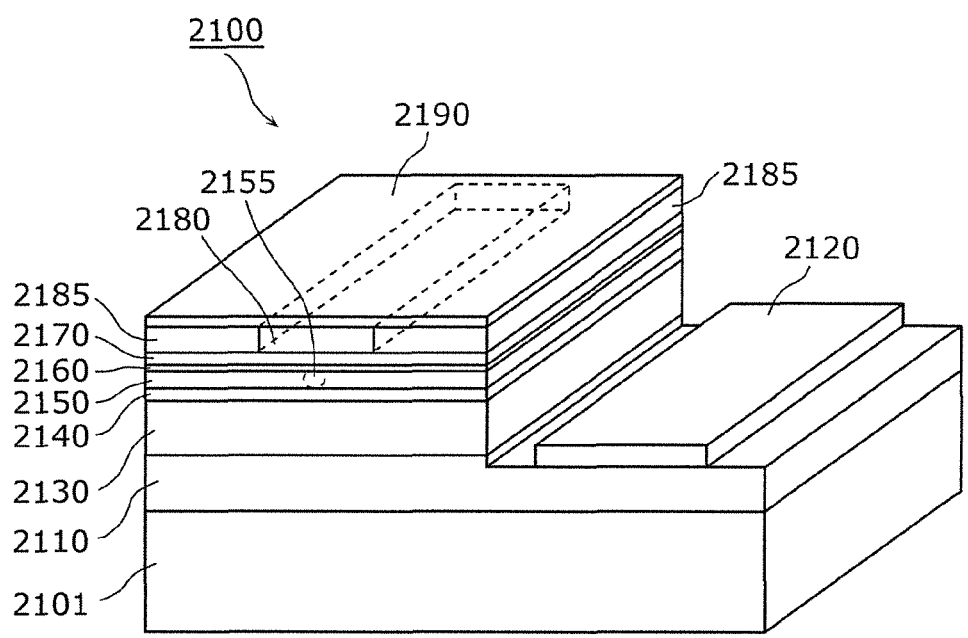
FIG. 17 shows a structure of a conventional laser diode.

Next, a method for manufacturing the nitride semiconductor light-emitting device 500 according to Embodiment 5 is described with reference to FIG. 16. FIG. 16 is a diagram showing the method for manufacturing the nitride semiconductor light-emitting device according to Embodiment 5.

As shown in (a) in FIG. 16, first, on the substrate 501, the lower cladding layer 502 is formed by forming, e.g., Si-doped $Al_{0.05}Ga_{0.95}N$ to have a film thickness of 1.5 μm by MOCVD. Then, the following are formed sequentially: the lower guide layer 503 which is, e.g., Si-doped n-type InGaN; the active layer 504 in which, e.g., a plurality of $In_{0.15}Ga_{0.85}N$ well layer/GaN barrier layer are formed (e.g., three layers); a first upper guide layer 505a which is, e.g., Mg-doped InGaN; an electronic barrier layer 506 which is, e.g., Mg-doped p-type $Al_{0.2}Ga_{0.8}N$; a second upper guide layer 505b which is, e.g., Mg-doped GaN; and the current blocking layer 530 which is, e.g., n-type AlGaN.

After that, a $SiO_2$ mask is formed on the current blocking layer 530 using the sputtering apparatus, and an opening having a width of, for example, 1.5 μm is formed by photolithography and wet etching. After that, an area to be the optical waveguide 520 is opened by photochemical wet etching, and then the $SiO_2$ mask is removed using hydrofluoric acid. Thus, as shown in (b) in FIG. 16, the structure can be obtained in which the opening to be the optical waveguide 520 is provided in the current blocking layer 530. It is to be noted that the first upper guide layer 505a is exposed in the opening at this time.

After that, as shown in (c) in FIG. 16, again by MOCVD, the first upper cladding layer 508 comprising, e.g., p-type $Al_{0.05}Ga_{0.95}N$ is formed on the first upper guide layer 505a and the current blocking layer 530 to bury the opening. Then, on the first upper cladding layer 508, the third upper cladding layer 508a comprising, e.g., an n-type InGaN/GaN super-lattice layer highly doped with Si is formed.

After that, the above is taken out from the growth chamber, and as shown in (c) in FIG. 16, the second upper cladding layer 509 is formed by forming, e.g., ITO by the electron beam vapor deposition apparatus or the sputtering apparatus. Thus, the three-layer upper cladding layer 507 can be formed.

After that, as shown in (d) in FIG. 16, the p-side electrode 540 comprising palladium (Pd) having a thickness of 45 nm and platinum (Pt) having a thickness of 50 nm is formed to cover the optical waveguide 520, by the photolithography and EB vapor deposition. Then, the pad electrode 541 is formed by forming a film by layering titanium (Ti) having a thickness of 50 nm and gold (Au) having a thickness of 1000 nm by the photolithography and EB vapor deposition, and then increasing the thickness of Au to 10 μm by electroplating.

After that, the thickness of the substrate 501 is reduced to approximately 100 μm by polishing using diamond slurry, and then, on the reverse face of the substrate 501, the following are formed by the EB vapor deposition apparatus as the n-type electrode 550: Ti having a thickness of 5 nm, Pt having a thickness of 10 nm, and Au having a thickness of 1000 nm. After that, the above is cleaved in bars and divided into chips. This is how the nitride semiconductor light-emitting device 500 according to the present embodiment is manufactured.

As described above, in the nitride semiconductor light-emitting device 500 according to Embodiment 5, the first upper cladding layer 508 comprising the nitride semiconductor is provided below the second upper cladding layer 509 comprising the transparent conductive film, in the same manner as in Embodiments 1 to 4. Therefore, the increase of the internal loss ($\alpha i$) caused by light absorption can be suppressed and the series resistance of the first upper cladding layer 508 can be reduced.

Furthermore, in the present embodiment, the third upper cladding layer 508a is formed between the first upper cladding layer 508 and the second upper cladding layer 509, in the same manner as in Embodiment 4. Therefore, the contact resistance between the second upper cladding layer 509 and the first upper cladding layer 508 can be further reduced.

Moreover, in the present embodiment, the nitride semiconductor light-emitting device 500 comprises the nitride semiconductor which includes the buried optical waveguide 520 and the current blocking layer 530 comprising n-type AlGaN or the like having higher heat conductivity than an oxide film such as $SiO_2$ or the like. Thus, Joule heat which occurs in the light-emitting portion near the active layer 504 can be released outside of the light-emitting portion efficiently. Furthermore, by increasing the Al composition of the current blocking layer 530 comprising n-type AlGaN, the light confinement effect in the lateral direction can be increased. Thus, the film thickness of the cladding layer comprising the nitride semiconductor according to the present embodiment can be even thinner. As a result, the series resistance of the cladding layer can be reduced even more, thereby further improving the current-light output characteristics of the nitride semiconductor light-emitting device. Accordingly, the electric power-light conversion efficiency can be improved even more.

Moreover, in the present embodiment, the contact area between the upper cladding layer comprising the nitride semiconductor (the third upper cladding layer 508a or the first upper cladding layer 508) and the cladding layer comprising the transparent conductive film (second upper cladding layer 509) is larger than that of other embodiments. Therefore, the contact resistance between the upper cladding layer comprising the nitride semiconductor and the cladding layer comprising the transparent conductive film can be further reduced.

In addition, since the third upper cladding layer 508a is formed between the first upper cladding layer 508 and the second upper cladding layer 509 in the present embodiment, the contact resistance can be further reduced by the tunnel current.

As described above, with the nitride semiconductor light-emitting device 500 according to Embodiment 5, a nitride semiconductor light-emitting device which can realize both the high light-emission efficiency and the low operating voltage is provided.

The foregoing has described the nitride semiconductor light-emitting device according to the present disclosure. However, the present disclosure is not determined by these embodiments.

For example, although the semiconductor laser has been described in Embodiments 1 and 3 to 5, a super luminescent diode can also be adopted in the same manner.

Furthermore, the optical waveguide in the straight shape has been described in Embodiments 1 and 3 to 5, however, as in Embodiment 2, the curved optical waveguide having the curved portion can also be adopted in the same manner.

Furthermore, in the above embodiments, the example is raised in which the resonator end face is formed by cleaving. However, a structure in which the light-emitting end face and the reflective end face are formed by dry etching can also be adopted in the same manner.

Furthermore, in the above embodiments, the example is raised in which the width of the ridge stripe (stripe width) of the optical waveguide is 1.5 µm. However, as long as the stripe width is smaller than or equal to 10 µm, the stripe width can be adopted to any of the embodiments in the same manner.

Furthermore, in the above embodiments, the example is raised in which the n-type GaN substrate having the (0001) face as the main face is used. However, an n-type GaN substrate having the (10-10) face, (11-20) face, (10-11) face, (11-21) face, or the like, as the main face can also be adopted in the same manner.

Furthermore, in the above embodiments, the example is raised in which the n-type GaN substrate is used as the substrate. However, another substrate such as a substrate comprising sapphire, SiC, Si, or the like, can also be adopted in the same manner.

Furthermore, in the above embodiments, ITO which is indium oxide (InO) added with tin (Sn) is used as the material for the transparent conductive film of the second upper cladding layer. However, this is not the only example. For example, zinc oxide (ZnO) doped with material such as Ga or Al, or tin oxide (SnO) added with Stibium (Sb) can also be used as the material for the transparent conductive film of the second upper cladding layer. Such a transparent conductive film can be used according to the desired refractive index.

In addition to the above, various modifications conceived by a person skilled in the art within a scope that does not deviate from a gist of the present disclosure are included within the scope of the present disclosure. Furthermore, constituent elements in the embodiments may be arbitrary combined within a scope that does not deviate from a drift of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The nitride semiconductor light-emitting device according to the present disclosure can be used in a wide variety of light-sources, and is particularly useful as a light-source for image display apparatuses such as displays or projectors, or for apparatuses which require relatively high light output such as laser apparatuses for use in industrial purpose including laser processing or laser annealing.

The invention claimed is:

1. A nitride semiconductor light-emitting device having an optical waveguide, the nitride semiconductor light-emitting device comprising, in the following order, at least:
   a first cladding layer;
   an active layer; and
   a second cladding layer, wherein the second cladding layer includes (i) a transparent conductive layer comprising a transparent conductor and (ii) a nitride semiconductor layer comprising a nitride semiconductor, the nitride semiconductor layer being formed closer to the active layer than the transparent conductive layer;

wherein the nitride semiconductor comprises $Al_xIn_yGa_{1-x-y}N$, where $0<x\leq0.82$, $0<y\leq0.18$, and $0\leq1-x-y<1$;

wherein a material of the transparent conductor is one of tin-added indium oxide, antimony-added tin oxide, and zinc oxide;

wherein the transparent conductive layer has a film thickness greater than 100 nm.

2. The nitride semiconductor light-emitting device according to claim 1, further comprising a guide layer formed between the active layer and the second cladding layer, wherein a total film thickness d of the guide layer and the second cladding layer satisfies $0.1\ \mu m<d<0.5\ \mu m$.

3. The nitride semiconductor light-emitting device according to claim 1, wherein the optical waveguide has a vertical mesa structure formed by digging from the second cladding layer to part of the first cladding layer.

* * * * *